US012690224B2

(12) United States Patent
Lu et al.

(10) Patent No.: US 12,690,224 B2
(45) Date of Patent: Jul. 21, 2026

(54) SEMICONDUCTOR STRUCTURE AND METHOD MANUFACTURING THE SAME

(71) Applicant: Taiwan Semiconductor Manufacturing Company, Ltd., Hsinchu (TW)

(72) Inventors: Meng-Pei Lu, Hsinchu City (TW); Shin-Yi Yang, New Taipei City (TW); Yun-Chi Chiang, Hsinchu City (TW); Han-Tang Hung, Taipei City (TW); Cian-Yu Chen, Taichung City (TW); Ming-Han Lee, Taipei City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 788 days.

(21) Appl. No.: 17/887,494

(22) Filed: Aug. 14, 2022

(65) Prior Publication Data

US 2024/0055496 A1     Feb. 15, 2024

(51) Int. Cl.
| | |
|---|---|
| *H10D 30/62* | (2025.01) |
| *H10D 64/23* | (2025.01) |
| *H10D 84/01* | (2025.01) |
| *H10W 20/00* | (2026.01) |
| *H10W 20/42* | (2026.01) |
| *H10W 20/44* | (2026.01) |
| *H10W 20/40* | (2026.01) |

(52) U.S. Cl.
CPC ....... *H10D 30/6219* (2025.01); *H10D 64/251* (2025.01); *H10D 64/254* (2025.01); *H10D 84/0149* (2025.01); *H10W 20/0261* (2026.01); *H10W 20/069* (2026.01); *H10W 20/42* (2026.01); *H10W 20/4403* (2026.01); *H10W 20/40* (2026.01)

(58) Field of Classification Search
CPC ............. H10D 30/6219; H10D 64/251; H10D 64/254; H10D 84/0149; H01L 21/76897; H01L 23/522; H10W 20/211; H10W 20/42; H10W 20/4403; H10W 20/0261
See application file for complete search history.

(56) References Cited

U.S. PATENT DOCUMENTS

| | | |
|---|---|---|
| 8,772,109 B2 | 7/2014 | Colinge |
| 8,785,285 B2 | 7/2014 | Tsai et al. |

(Continued)

FOREIGN PATENT DOCUMENTS

| | | | | |
|---|---|---|---|---|
| KR | 20260026516 A | * | 2/2026 | .......... H10W 80/312 |

*Primary Examiner* — Joseph C. Nicely
(74) *Attorney, Agent, or Firm* — JCIPRNET

(57) ABSTRACT

A semiconductor structure includes a substrate, at least one gate electrode, a plurality of source/drain (S/D) regions, a backside contact, a first dielectric layer, and a conductive via. The at least one gate electrode is disposed in the substrate. The S/D regions is disposed in the substrate and laterally disposed aside the at least one gate electrode. The backside contact is disposed above the S/D regions and the at least one gate electrode. The first dielectric layer is disposed between the backside contact and the plurality of S/D regions and the at least one gate electrode. The conductive via is extended through the first dielectric layer to electrically connect the S/D regions and the backside contact. The conductive via includes an anisotropic transport material or a topological material.

20 Claims, 38 Drawing Sheets

(56) References Cited

U.S. PATENT DOCUMENTS

| | | | |
|---|---|---|---|
| 8,816,444 B2 | 8/2014 | Wann et al. | |
| 8,823,065 B2 | 9/2014 | Wang et al. | |
| 8,860,148 B2 | 10/2014 | Hu et al. | |
| 9,105,490 B2 | 8/2015 | Wang et al. | |
| 9,236,267 B2 | 1/2016 | De et al. | |
| 9,236,300 B2 | 1/2016 | Liaw | |
| 9,520,482 B1 | 12/2016 | Chang et al. | |
| 9,576,814 B2 | 2/2017 | Wu et al. | |
| 12,564,041 B2 * | 2/2026 | Do | H10D 84/0186 |
| 2015/0333163 A1 * | 11/2015 | Qiliang | H10D 48/385 |
| | | | 257/24 |
| 2019/0067290 A1 * | 2/2019 | Wang | H10D 84/834 |
| 2020/0075595 A1 * | 3/2020 | Shin | H10D 84/853 |
| 2020/0135723 A1 * | 4/2020 | Zang | H10D 84/0147 |
| 2020/0235055 A1 * | 7/2020 | Hegde | H10W 20/033 |
| 2021/0305262 A1 * | 9/2021 | Wang | H10B 10/125 |
| 2021/0305428 A1 * | 9/2021 | Ju | H10D 30/6211 |
| 2021/0335675 A1 * | 10/2021 | Tsao | H10D 84/038 |
| 2021/0335709 A1 * | 10/2021 | Wang | H10D 62/121 |
| 2021/0336012 A1 * | 10/2021 | Huang | H10D 64/01 |
| 2021/0336019 A1 * | 10/2021 | Su | H10D 64/017 |
| 2021/0375857 A1 * | 12/2021 | Huang | H10D 62/121 |
| 2022/0037528 A1 * | 2/2022 | Chuang | H10D 30/6211 |
| 2022/0052157 A1 * | 2/2022 | Chang | H10D 30/6729 |
| 2022/0130970 A1 * | 4/2022 | Kang | H10D 64/258 |
| 2022/0157733 A1 * | 5/2022 | Chen | H10W 20/063 |
| 2022/0384311 A1 * | 12/2022 | Oh | H10W 20/023 |
| 2022/0384661 A1 * | 12/2022 | Cho | H10D 30/6728 |
| 2022/0406939 A1 * | 12/2022 | Kim | H10D 86/011 |
| 2023/0253293 A1 * | 8/2023 | Cho | H10D 30/014 |
| | | | 257/732 |
| 2023/0307352 A1 * | 9/2023 | Reshotko | H10W 20/072 |
| 2023/0335492 A1 * | 10/2023 | Do | H10D 84/0186 |
| 2023/0343838 A1 * | 10/2023 | Chang | H10D 30/6729 |
| 2023/0369217 A1 * | 11/2023 | Xie | H10W 20/023 |
| 2023/0386921 A1 * | 11/2023 | Yang | H10D 30/62 |
| 2023/0386993 A1 * | 11/2023 | Huang | H10W 20/427 |
| 2023/0402519 A1 * | 12/2023 | Anderson | H10D 84/0149 |
| 2023/0420367 A1 * | 12/2023 | Xie | H10D 88/00 |
| 2024/0021673 A1 * | 1/2024 | Huang | H10D 64/017 |
| 2024/0038841 A1 * | 2/2024 | Park | H10D 62/121 |
| 2024/0274509 A1 * | 8/2024 | Cho | H10W 20/20 |
| 2025/0344434 A1 * | 11/2025 | Yu | H10D 30/62 |

* cited by examiner

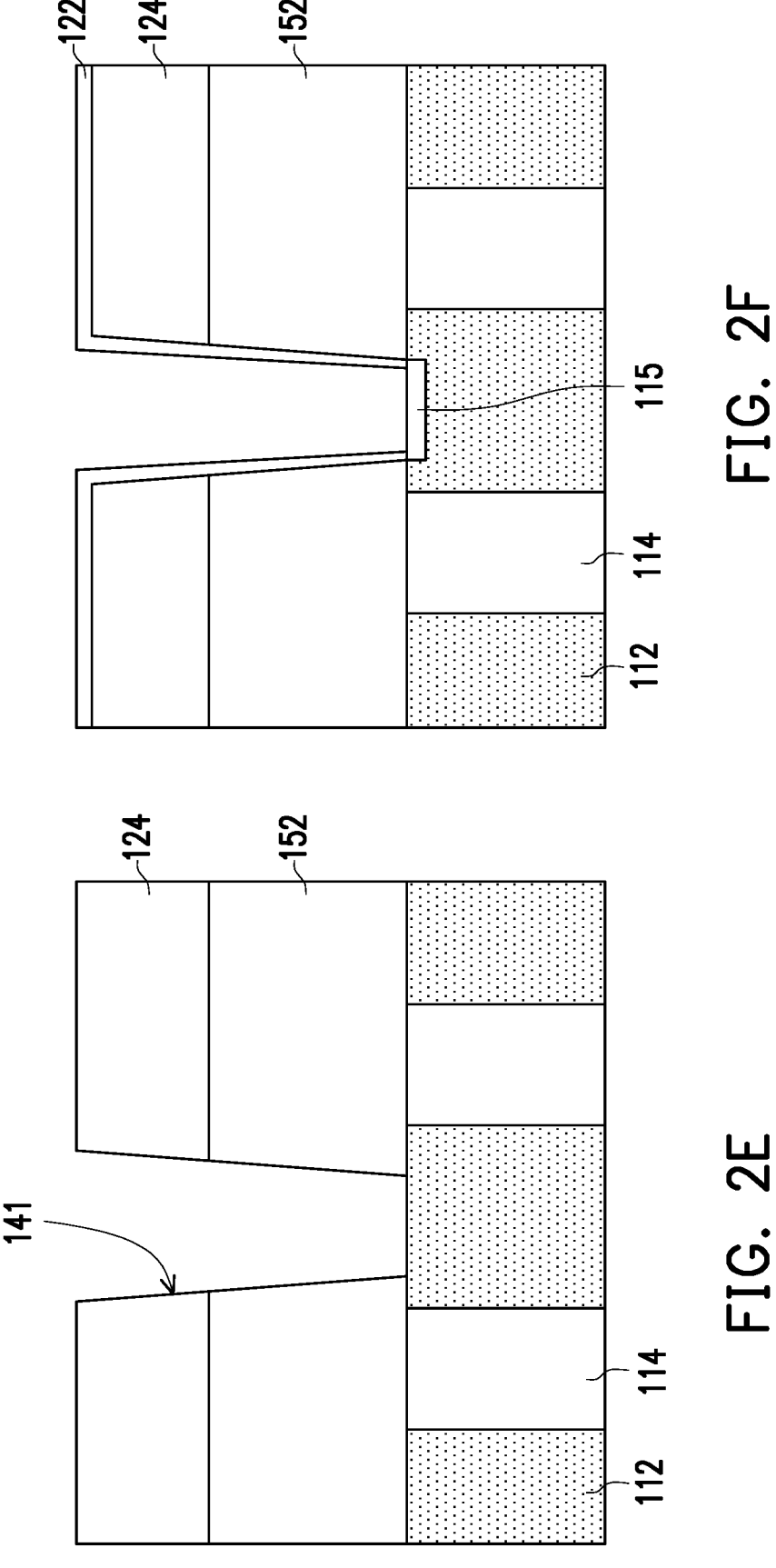

<u>200</u>

202 — Providing a substrate having an interconnect structure with a dielectric layer disposed thereon 204 — Bonding a carrier on a back side of the substrate 206 — Flipping the substrate for thinning down the dielectric layer 208 — Depositing a hard mask on the dielectric layer 210 — Forming an opening penetrating the hard mask layer and the dielectric layer 212 — Depositing a barrier liner on a side wall of the opening 214 — Filling a conductive material into the opening to form the conductive via 216 — Performing a planarization process to remove excessive portions of the conductive material, the barrier liner, and the hard mask layer 218 — Depositing a barrier layer and a backside contact on the dielectric layer and the conductive via

FIG. 3

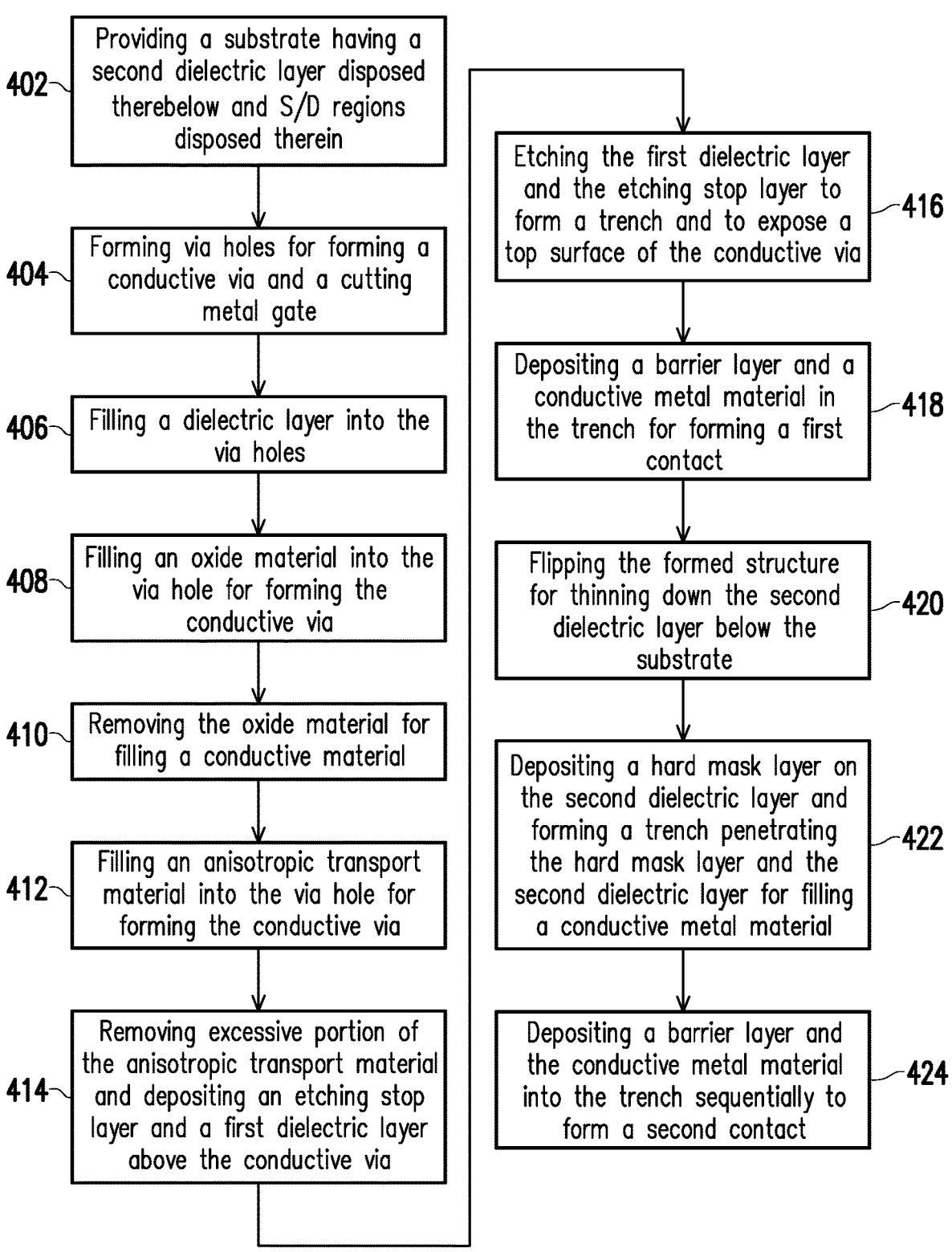

402 — Providing a substrate having a second dielectric layer disposed therebelow and S/D regions disposed therein 404 — Forming via holes for forming a conductive via and a cutting metal gate 406 — Filling a dielectric layer into the via holes 408 — Filling an oxide material into the via hole for forming the conductive via 410 — Removing the oxide material for filling a conductive material 412 — Filling an anisotropic transport material into the via hole for forming the conductive via 414 — Removing excessive portion of the anisotropic transport material and depositing an etching stop layer and a first dielectric layer above the conductive via 416 — Etching the first dielectric layer and the etching stop layer to form a trench and to expose a top surface of the conductive via 418 — Depositing a barrier layer and a conductive metal material in the trench for forming a first contact 420 — Flipping the formed structure for thinning down the second dielectric layer below the substrate 422 — Depositing a hard mask layer on the second dielectric layer and forming a trench penetrating the hard mask layer and the second dielectric layer for filling a conductive metal material 424 — Depositing a barrier layer and the conductive metal material into the trench sequentially to form a second contact

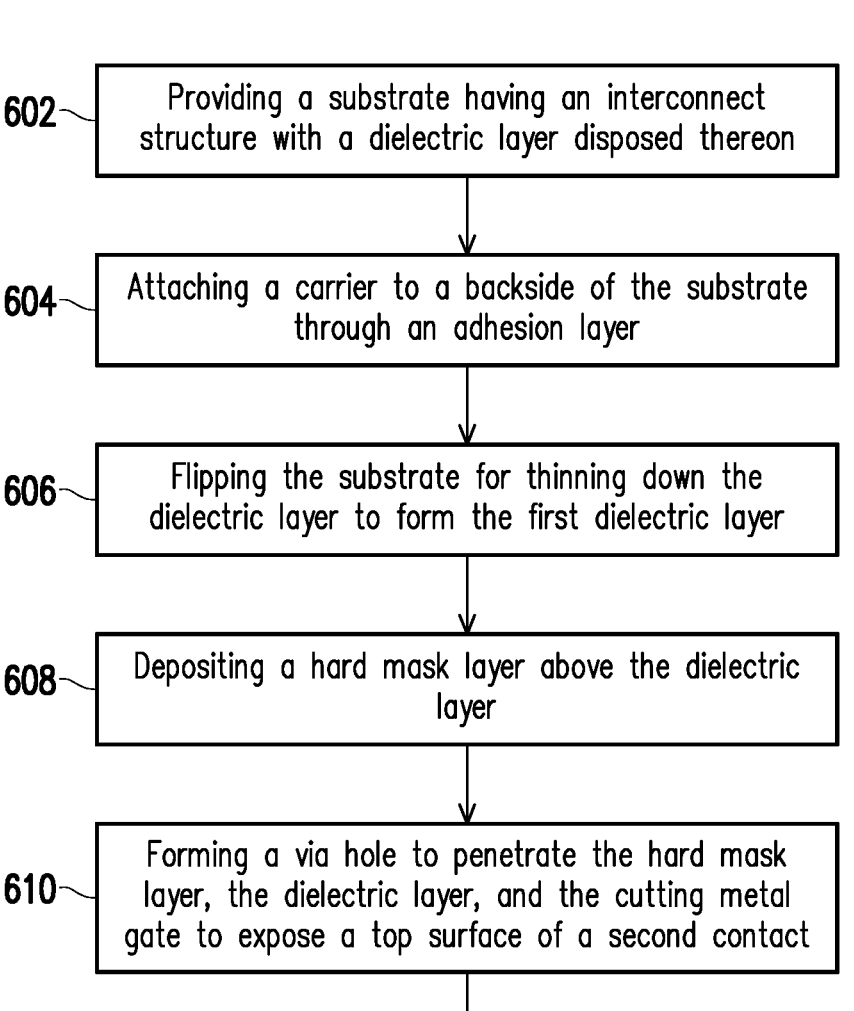

602 — Providing a substrate having an interconnect structure with a dielectric layer disposed thereon 604 — Attaching a carrier to a backside of the substrate through an adhesion layer 606 — Flipping the substrate for thinning down the dielectric layer to form the first dielectric layer 608 — Depositing a hard mask layer above the dielectric layer 610 — Forming a via hole to penetrate the hard mask layer, the dielectric layer, and the cutting metal gate to expose a top surface of a second contact 612 — Filling an anisotropic transport material into the via hole to form the conductive via

FIG. 11

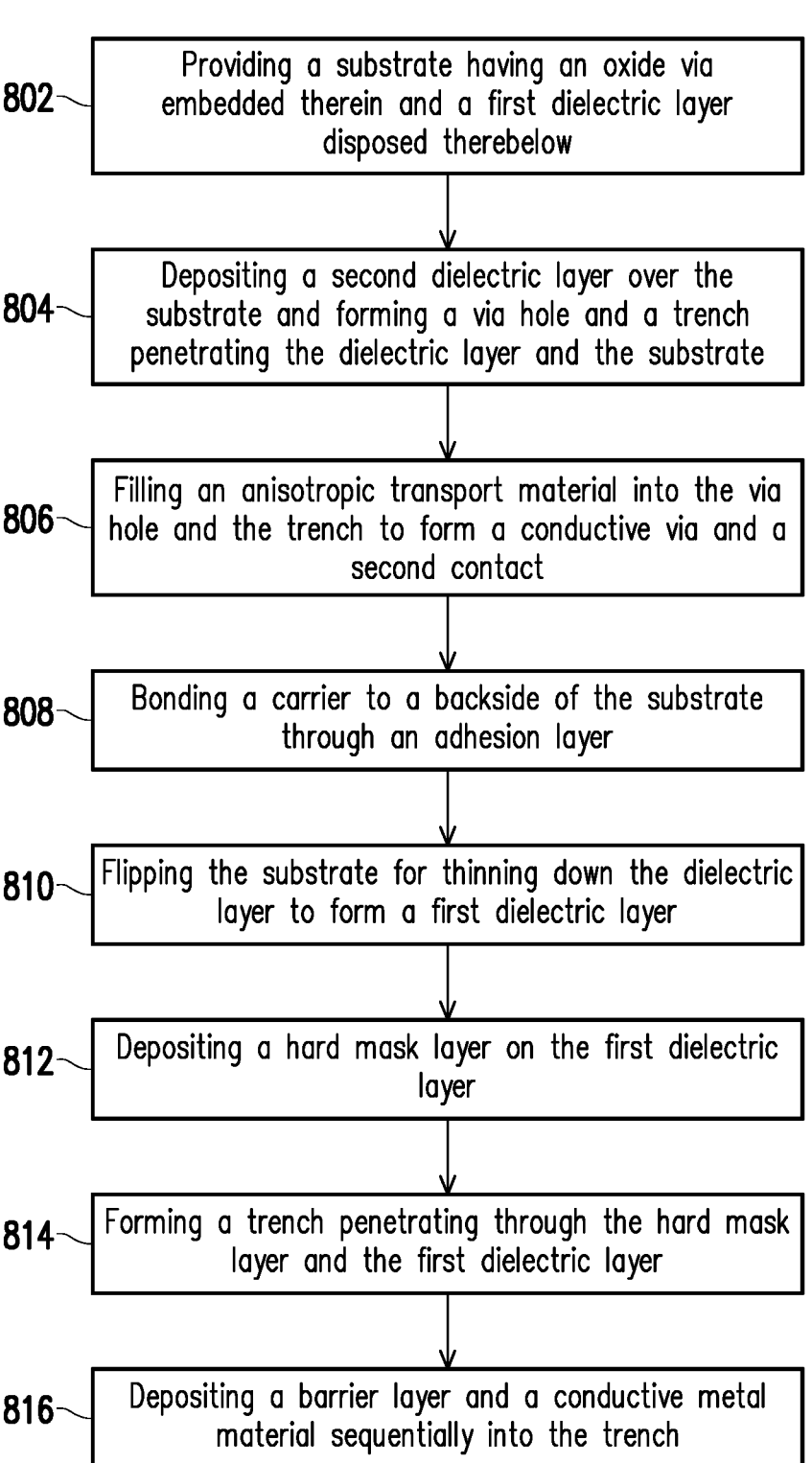

800

802 — Providing a substrate having an oxide via embedded therein and a first dielectric layer disposed therebelow 804 — Depositing a second dielectric layer over the substrate and forming a via hole and a trench penetrating the dielectric layer and the substrate 806 — Filling an anisotropic transport material into the via hole and the trench to form a conductive via and a second contact 808 — Bonding a carrier to a backside of the substrate through an adhesion layer 810 — Flipping the substrate for thinning down the dielectric layer to form a first dielectric layer 812 — Depositing a hard mask layer on the first dielectric layer 814 — Forming a trench penetrating through the hard mask layer and the first dielectric layer 816 — Depositing a barrier layer and a conductive metal material sequentially into the trench

FIG. 15

SEMICONDUCTOR STRUCTURE AND METHOD MANUFACTURING THE SAME

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that may be created using a fabrication process) has decreased. This scaling down process generally provides benefits by increasing production efficiency and lowering associated costs.

Such scaling down has also increased the complexity of manufacturing ICs and may result in the increase of the conductive resistivity between the conductive elements, for these advances to be realized, developments in IC and its related elements are needed.

BRIEF DESCRIPTION OF THE DRAWINGS

Aspects of the disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2A to FIG. 2I are schematic cross-sectional views illustrating a method of forming a semiconductor structure according to an embodiment of the disclosure.

FIG. 3 is a flowchart of a method for forming a semiconductor structure according to various aspects of the present disclosure.

FIG. 7 is a flowchart of a method for forming a semiconductor structure according to various aspects of the present disclosure.

FIG. 11 is a flowchart of a method for forming a semiconductor structure according to various aspects of the present disclosure.

FIG. 15 is a flowchart of a method for forming a semiconductor structure according to various aspects of the present disclosure.

DETAILED DESCRIPTION

Figure 1A:
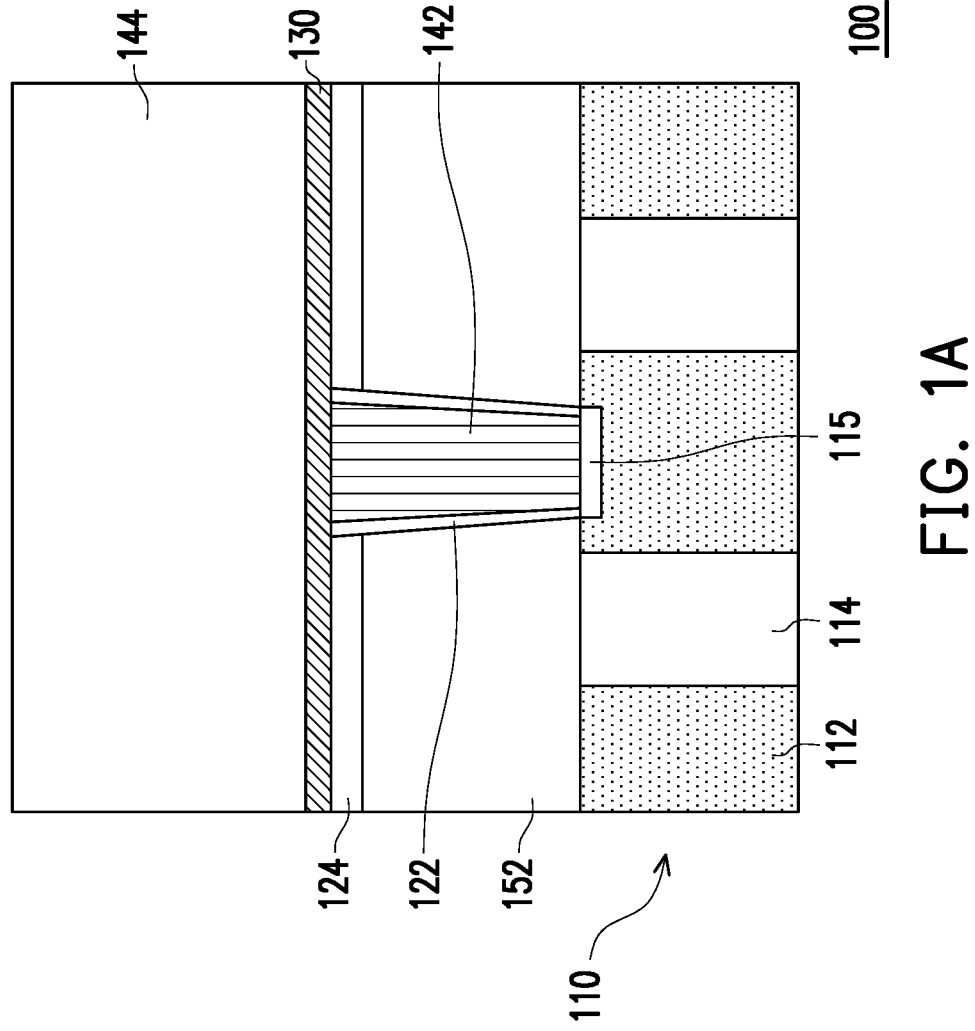
FIG. 1A and FIG. 1B a schematic cross-sectional view showing a semiconductor structure in accordance with an embodiment of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the FIGS. The spatially relative terms are intended to encompass different orientations of the device in use or operation in addition to the orientation depicted in the FIGS. The apparatus may be otherwise oriented (rotated 90 degrees or at other orientations) and the spatially relative descriptors used herein may likewise be interpreted accordingly.

In some embodiments in which the semiconductor structure is FinFET device, the fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Figure 1B:
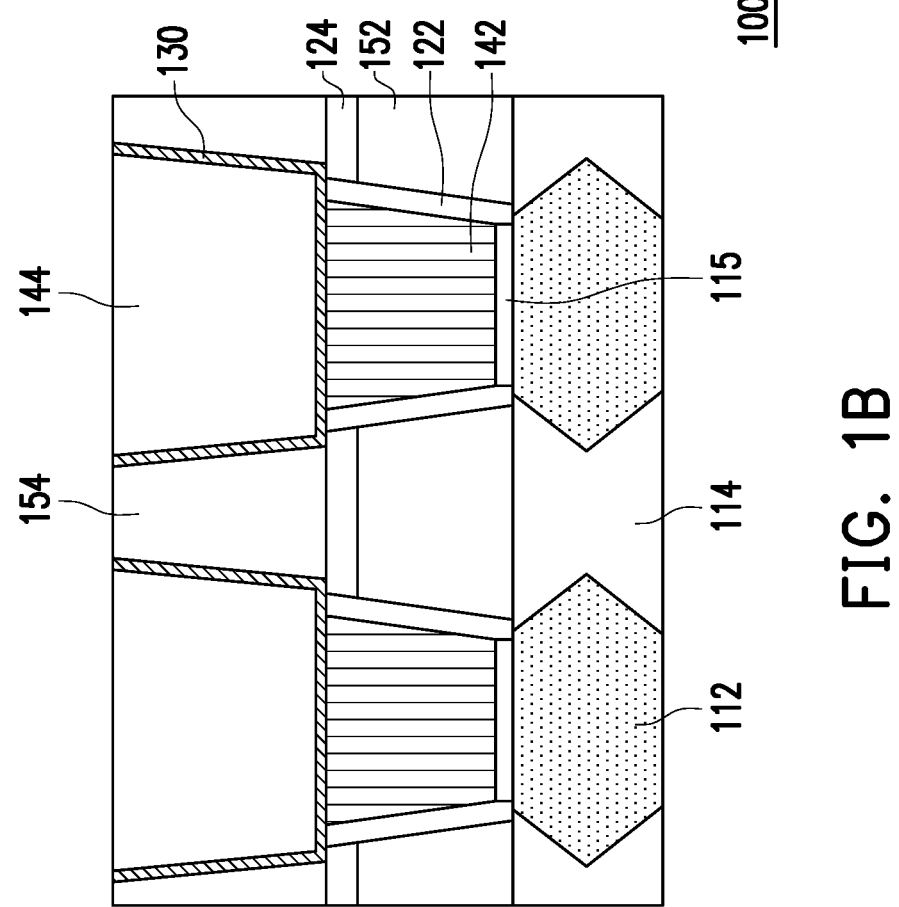

FIG. 1A and FIG. 1B a schematic cross-sectional view showing a semiconductor structure 100 in accordance with an embodiment of the disclosure. FIG. 1A is the schematic cross-sectional view along a X direction of the semiconductor structure 100, and FIG. 1B is the schematic cross-sectional view along a Y direction of the semiconductor structure 100. Referring to FIG. 1A and FIG. 1B, in some embodiments, a semiconductor structure 100 includes a substrate 110, gate electrodes 114, a plurality of source/drain (S/D) regions 112, a backside contact 144, a first dielectric layer 152, and a conductive via 142. In accordance with at least an embodiment, the gate electrodes 114 are disposed in the substrate 110. In some other embodiments, a number of the gate electrodes 114 may be singular but not limited herein. The number of the gate electrodes 114 may be adjusted based on practical designs and needs of the semiconductor structure 100. Moreover, the S/D regions 112 are disposed in the substrate 110 and laterally disposed aside the gate electrodes 114. As shown in FIG. 1A and FIG. 1B, in the present embodiment, the S/D regions 112 may be laterally aligned with the gate electrodes 114 in an alternative manner.

The backside contact 144 is disposed above the S/D regions 112 and the gate electrodes 114. The first dielectric layer 152 is disposed between the backside contact 133 and the S/D regions 112. In some embodiments, the conductive via 142 is vertically extended from the S/D regions 112 to electrically contact with the backside contact 144.

In some embodiments, a dimension of the conductive via 142 along a vertical direction in FIG. 1A may be in range from 1 nanometer to 1000 nanometers. In the present embodiment, the conductive via 142 may be formed of an anisotropic transport material or a topological material. In some embodiment, the anisotropic transport material can be MAX phases (e.g., $M_{n+1}AX$, n=1-4), in which M may be early transition metals such as Sc, Ti, Cr, Zr, Nb, Mo, Hf, Ta.

Moreover, A in the above MAX phases may be IIIA, IVA element, such as Zn, Cd, Al, Ga, In, Ti, Si, Ge, Sn, Pb, P, As, S, and X may be C or N.

In some other embodiments, the anisotropic transport materials may be metal alloys or intermetallic compounds which possess anisotropic crystal structure. The alloy component may be transition metals such as Sc, To, V, Cr, Mn, Fe, Co, Cu, Zn, Y, Zr, Nb, Mo, Tc, Ru, Rh, Pd, Ag, Hf, Ta, W, Re, Os, Ir, Pt, Au, and other metal and semi-metal Al, Ga, In, Ge, Sn, Pb, As, Sb, Bi, Se, Te. In some embodiments, the metal alloys may be binary, ternary, quaternary, or more element systems.

In some embodiments, different annealing process involving, for example, rapid thermal annealing (RTA), laser annealing, or annealing furnace may be applied to improve the crystallinity and reduce resistivity of alloys or enhance formation of the intermetallic compounds. In the present embodiment, the annealing temperature of the alloy may be in a range from 100° C. to 1000° C.

In some embodiments, the topological material may be a topological insulator or topological semimetals. The topological insulator may be $Bi_2Te_3$, $Sb_2Te_3$, $Bi_{1-x}Sb_x$, $Bi_2Se_3$, and other Bi based chalcogenides system, which possess bulk band gap and conductive surface states. In accordance with some embodiments, the topological semimetal can be NbP, TaAs, NbAs, TaP, $WTe_2$, $MoTe_2$, $WP_2$, $MoP_2$, $Cd_3As_2$, $PtSn_4$, LaSb, LaBi, $PtBi_2$, $ZrTe_5$, $HfTe_5$, $PbTaSe_2$, ZrSiS, HfSiS, $NbAs_2$, $TaAs_2$, and other material systems, which possess topological protected conductive surface states. In some embodiments, the topological material may be doped with magnetic material, for example, Co, Fe, Ni to improve the transport properties.

In the present embodiment, the anisotropic transport material can have a specific lower conductive resistivity, compared to a conventional metal material such as copper, on a certain charge transport direction, for example, a vertical direction in FIG. 1A. Moreover, the conductive resistivity of the anisotropic transport material is not affected by scaling from another direction, such as a direction perpendicular to the transport direction of the charge.

In the present embodiment, the topological materials have exotic transport properties, which also results in a lower resistivity, compared to the conventional metal material such as copper, as the dimension of the semiconductor structure 100 is scaled down.

Through configuring the conductive via 142 formed of the anisotropic transport material or the topological material between the S/D regions 112, as the overall dimension of the semiconductor structure 100 is scaled down, an increase of the conductive resistivity of the conductive via 142 can be mitigated.

In some embodiments, the substrate 110 may be a semiconductor substrate, such as a bulk semiconductor substrate, a semiconductor-on-insulator (SOI) substrate, or the like, which may be doped (e.g., with a p-type or an n-type dopant) or undoped. The substrate 110 may be a wafer, such as a silicon wafer. In general, an SOI substrate is a layer of a semiconductor material (such as silicon) formed on an insulator layer. The insulator layer may be, for example, a buried oxide (BOX) layer a silicon oxide layer, or the like. The insulator layer is provided on a substrate typically a silicon or glass substrate. In some embodiments, the substrate may be a multilayered or gradient substrate. In some embodiments, the semiconductor material of the substrate 110 may include silicon, germanium, or a compound semiconductor. The compound semiconductor may include silicon carbide (SiC), gallium arsenic (GaAs), gallium phosphide (GaP), indium phosphide (InP), indium arsenide (InAs), and/or indium antimonide (InSb). In addition, an alloy semiconductor including SiGe, GaAsP, AlInAs, AlGaAs, GaInAs, GaInP, and/or GaInAsP; or combinations thereof.

In some other embodiments, depending on practical needs of various applications, the substrate 110 may be a P-type substrate, an N-type substrate or a combination thereof and may have doped regions therein. The substrate 110 may be configured for an NMOS device, a PMOS device, an N-type FinFET device, a P-type FinFET device, other kinds of devices (such as, multiple-gate transistors, gate-all-around transistors or nanowire transistors) or combinations thereof. In some embodiments, the substrate 110 for NMOS device or N-type FinFET device may include Si, SiP, SiC, SiPC, InP, GaAs, AlAs, InAs, InAlAs, InGaAs or combinations thereof. The substrate 110 for PMOS device or P-type FinFET device may include Si, SiGe, SiGeB, Ge, InSb, GaSb, InGaSb or combinations thereof. In some embodiments, the substrate 110 may be configured for a FinFET device, and the substrate 110 may include a plurality of fins (not shown).

Referring again to FIG. 1A and FIG. 1B, the S/D regions 112 and the gate electrodes 114 are formed in the substrate 110, and the gate electrodes 114 are formed aside the S/D regions 112. In some embodiments, the S/D regions 112 may be configured for a PMOS device or P-type FinFET and include p-type dopants, such as boron, $BF_2^+$, and/or a combination thereof. In an alternative embodiment, the S/D regions 112 are doped regions configured for a NMOS device or N-type FinFET and include n-type dopants, such as phosphorus, arsenic, and/or a combination thereof. The S/D regions 112 may be formed by an ion implanting process with the gate electrode. However, the present disclosure is not limited thereto.

In some other embodiments, the S/D regions 112 are strained layers formed by epitaxial growing process such as selective epitaxial growing process. In some embodiments, recesses are formed in the substrate 110 on sides of the gate electrode 114, and the strained layers are formed by selectively growing epitaxy from the recesses. In some embodiments, the strained layers may include silicon germanium (SiGe), SiGeB, Ge, InSb, GaSb, InGaSb, or combination thereof for a P-type MOS or FinFET device. In some alternative embodiments, the strained layer may include silicon carbon (SiC), silicon phosphate (SiP), SiCP, InP, GaAs, AlAs, InAs, InAlAs, InGaAs, or a SiC/SiP multi-layer structure, or combination thereof for an N-type MOS or FinFET device. In some embodiments, the strained layers may be optionally implanted with an N-type dopant or a P-type dopant according to practical needs or applications.

In some embodiments, the gate electrodes 114 may include doped polysilicon, undoped polysilicon, or metal-containing conductive material. In some embodiments, the gate electrodes 114 may include a work function metal layer and a fill metal layer on the work function metal layer. In some embodiments, the work function metal layer is an N-type work function metal layer or a P-type work function metal layer. In some embodiments, the N-type work function metal layer includes TiAl, TiAlN, or TaCN, conductive metal oxide, and/or a suitable material. In alternative embodiments, the P-type work function metal layer includes TiN, WN, TaN conductive metal oxide, and/or a suitable material. The fill metal layer includes copper, aluminum, tungsten, or other suitable materials. In some embodiments, the gate electrode 114 may further include a liner layer, an interface layer, a seed layer, an adhesion layer, a barrier layer, a combination thereof or the like.

In some embodiments, the first dielectric layer 152 may be an interlayer dielectric layer (ILD). In some embodiments, the first dielectric layer 152 may include silicon oxide, carbon-containing oxide such as silicon oxycabide (SiOC), silicate glass, tetraethylorthosilicate (TEOS) oxide, un-doped silicate glass, or doped silicon oxide such as borophosphosilicate glass (BPSG), fluorine-doped silica glass (FSG), phosphosilicate glass (PSG), boron doped silicon glass (BSG), combinations thereof and/or other suitable dielectric materials. In some embodiments, the first dielectric layer 152 may be silicon-nitrides such as SiNx and the related dielectric materials. In some embodiments, the first dielectric layer 152 may include low-k dielectric layer with a low-k dielectric material and may further include a high-k material. In some embodiments, the low-k material includes a polymer-based material such as benzocyclobutene (BCB), FLARE®, or SILK®; or a silicon dioxide-based material, such as hydrogen silsesquioxane (HSQ) or SiOF. The high-k dielectric material includes $ZrO_2$, $HfO_2$, for example. The dielectric layer 152 may be a single layer structure or a multi-layer structure. In the present embodiments, the k-value of first dielectric material 152 may be in the range between 1 to 5.

In some embodiments, a silicide layer 115 may be formed between the conductive via 142 and one of the S/D regions 112. In some embodiments, the silicide layer 115 may include platinum silicide (PtSi), nickel silicide (NiSi), palladium silicide (PdSi), cobalt silicide (CoSi), titanium silicide (TiSi), tungsten silicide (WSi), molybdenum silicide (MoSi), CoSi, NiCoSi, RhSi, NiPtSi, Ir, PtIrSi, YbSi, ErSi, PdSi, or NbSi, or combinations thereof.

In some embodiments, a vertical thickness of the backside contact 144 is in a range from 1 nanometer to 1000 nanometers. In the present embodiment, the backside contact 144 may be composed of a conventional metal material such as copper. In some other embodiment, the backside contact 144 may be composed of an anisotropic transport material or a topological material.

Referring again to FIG. 1A and FIG. 1B, in the present embodiments, a barrier liner 122 is disposed between the conductive via 142 and the first dielectric layer 152. In some embodiments, the barrier liner 122 may include titanium, titanium nitride, tantalum nitride, manganese nitride, or a combination thereof.

In some embodiments, a hard mask layer 124 is disposed between the dielectric layer 152 and the backside contact 144. In accordance with the present embodiment, the hard mask layer 124 may include silicon nitride, silicon carbon nitride, and other dielectric materials.

Still referring to FIG. 1A and FIG. 1B, a barrier layer 130 may be disposed between the backside contact 144 and the conductive via 142. In some embodiments, the barrier layer 130 may include tantalum, titanium, titanium nitride, tantalum nitride, manganese nitride, or a combination thereof. In the present embodiment, the barrier layer 130 may serve as a diffusion barrier to prevent diffusion of the metal atoms of the backside contact 144.

Figure 2B:
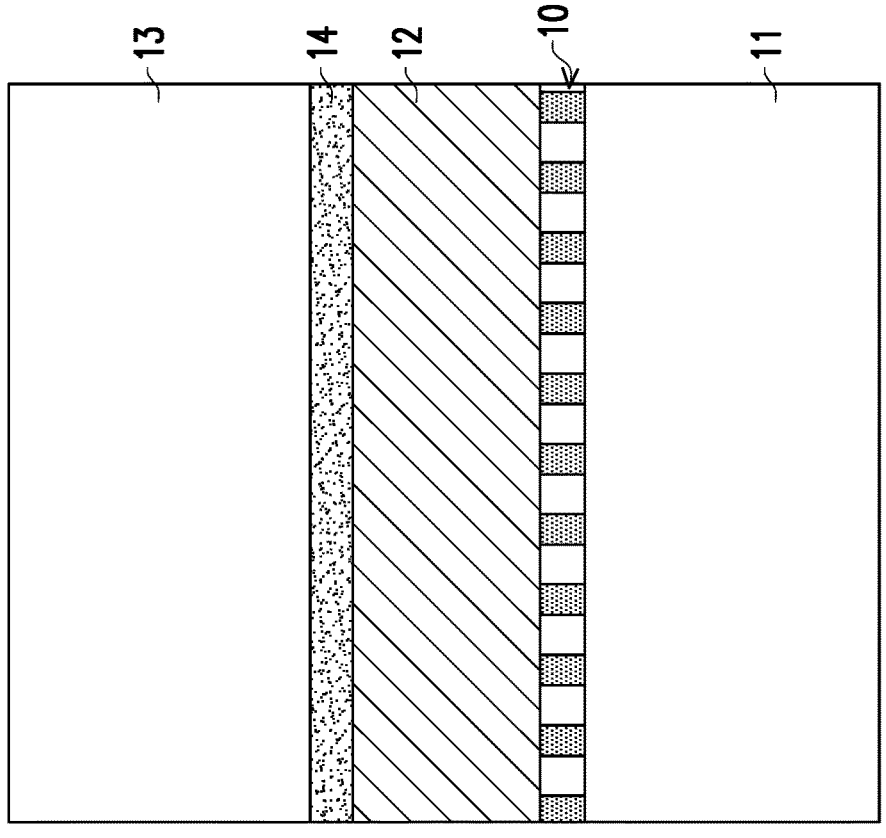
Figure 2A:
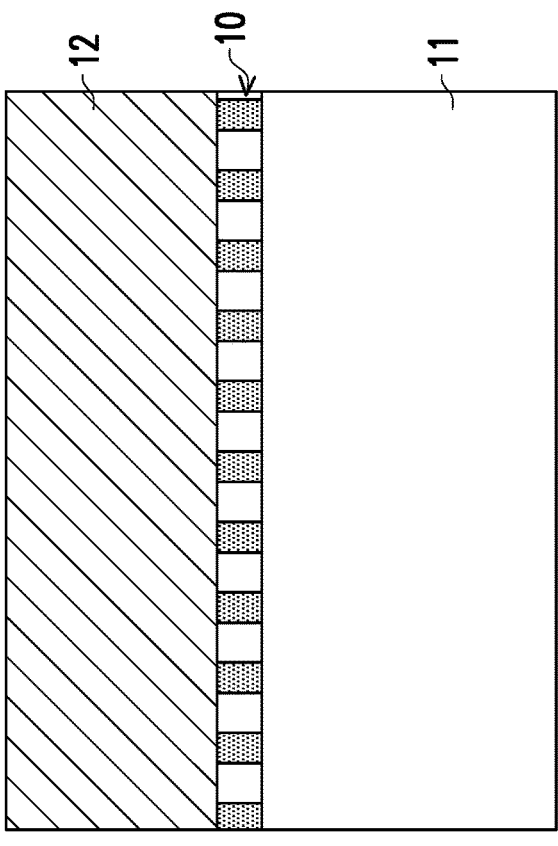

FIG. 2A to FIG. 2I are schematic cross-sectional views illustrating a method of forming the semiconductor structure 100 according to an embodiment of the disclosure. FIG. 3 is a flowchart of a method for forming the semiconductor structure 100 according to various aspects of the present disclosure. Referring to FIG. 2A and FIG. 3, in the manufacturing step 202, a substrate 12 having an interconnect structure 10 with a dielectric layer 11 disposed thereon is provided. Followingly, referring to FIG. 2B and FIG. 3, in the manufacturing step 204, a carrier 13 is bonded to the to a back side of the substrate 12 through an adhesion layer 14.

Figures 2C, 2D:
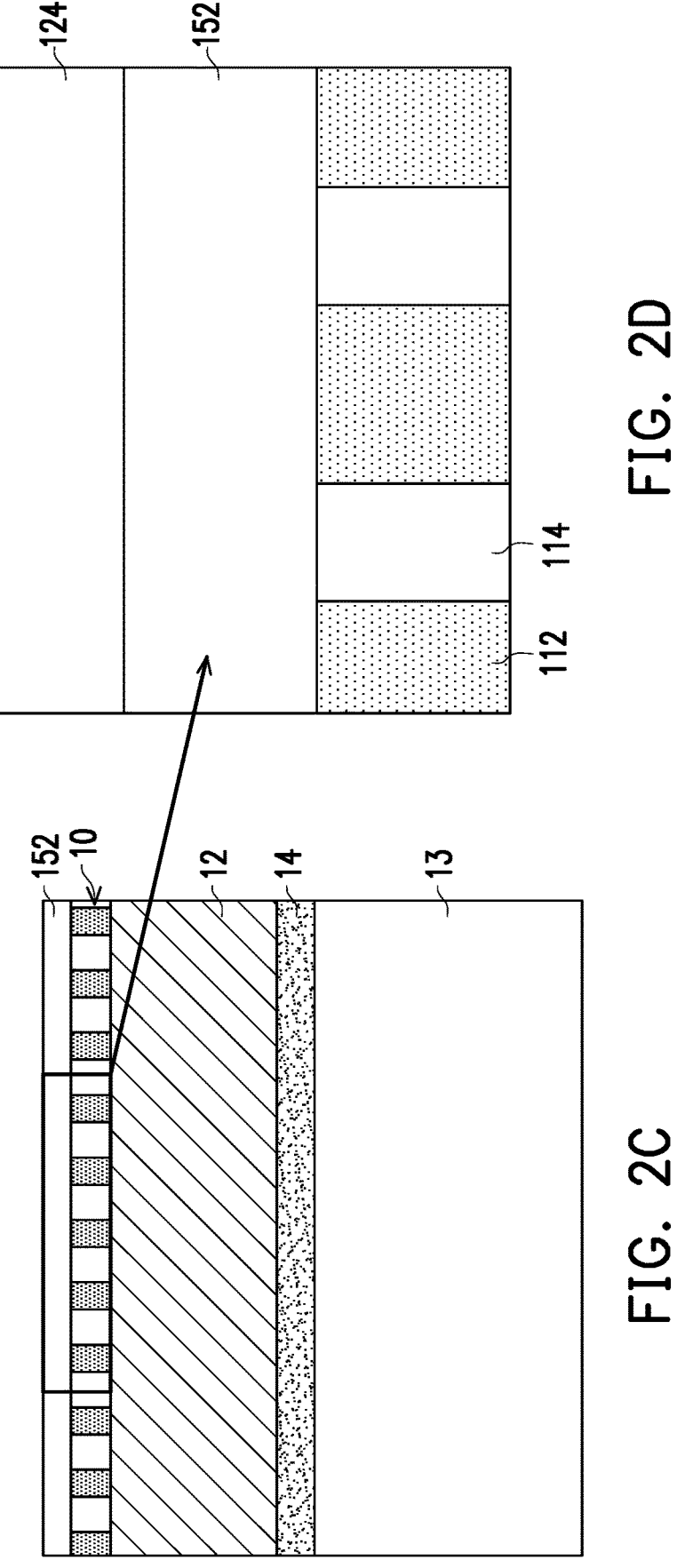

Referring to FIG. 2C and FIG. 3, in the manufacturing step of FIG. 3, the substrate 12 is flipped for thinning down the dielectric layer 11. In the present manufacturing step, the dielectric layer 11 is thinned down to from a dielectric layer 152. Referring to FIG. 2D and FIG. 3, FIG. 2D illustrates an enlargement of a circled portion in FIG. 2C. In the manufacturing step 208, a hard mask layer 124 is deposited on the dielectric layer 152. Referring to FIG. 2E and FIG. 3, in the manufacturing step 210, an opening such as a via hole 141 penetrating through the hard mask layer 124 and the dielectric layer 152 is formed. In some embodiments, the via hole 141 may be a via trench and may be formed by a photo-lithograph and one or more etching processes.

Referring to FIG. 2F and FIG. 3, in the manufacturing step 212, a barrier liner 122 is deposited on the hard mask layer 124 and a side wall of the via hole 141. Moreover, the silicide layer 115 is then formed on the bottom of the via hole 141 to be in contact with one of the S/D regions 112. Referring to FIG. 2G and FIG. 3, in the manufacturing step 214, a conductive material, such as the anisotropic transport material or the topological material is filled into the via hole 141 to form the conducive via 142.

In the present embodiment, the anisotropic transport material and the topological material may be filled in the via hole 141 by physical vapor deposition (PVD), chemical vapor deposition (CVD), atonic layer deposition (ALD, plasma-enhanced atomic layer deposition (PE-ALD), and plasma-enhanced chemical vapor deposition (PE-CVD) with a process temperature in a range from 100° C. to 1000° C.

Figure 2H:
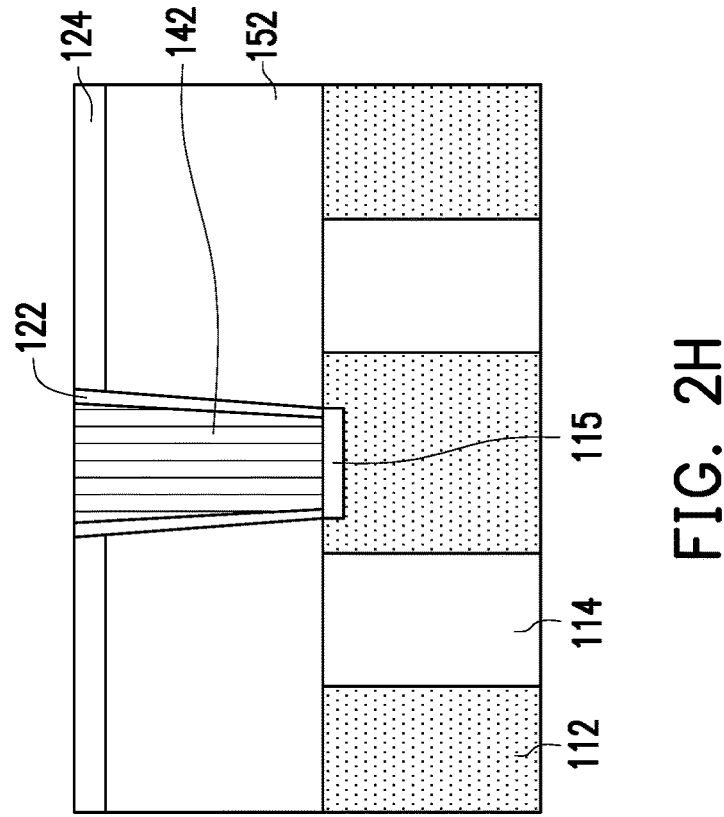
Figure 2G:
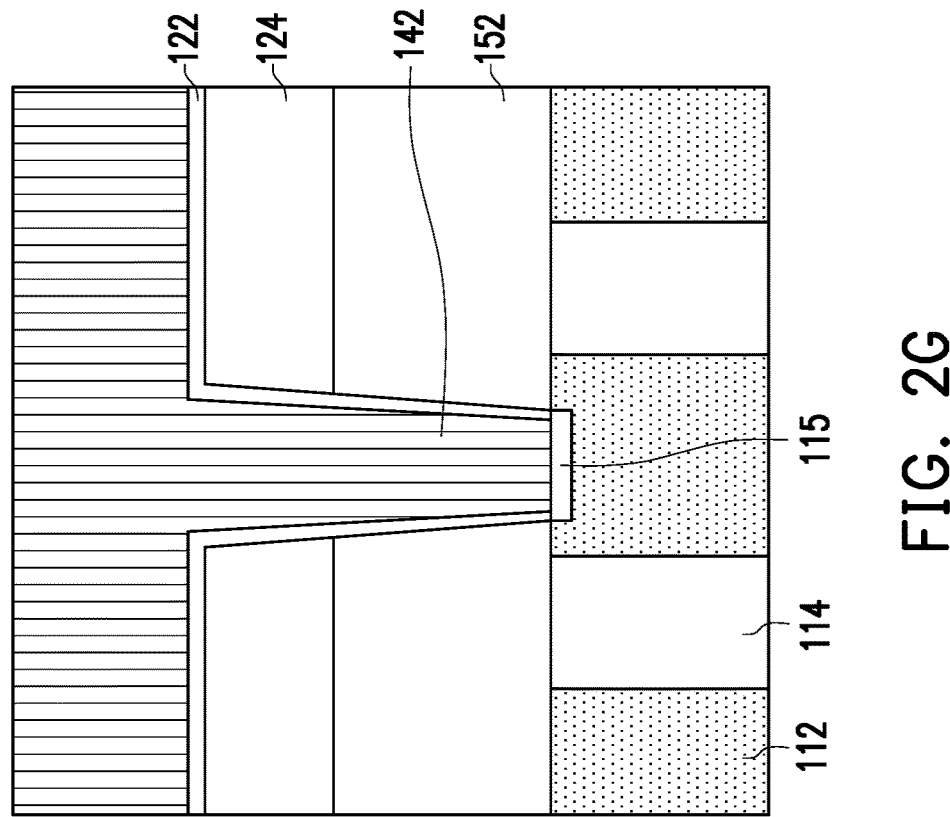
Figure 21:
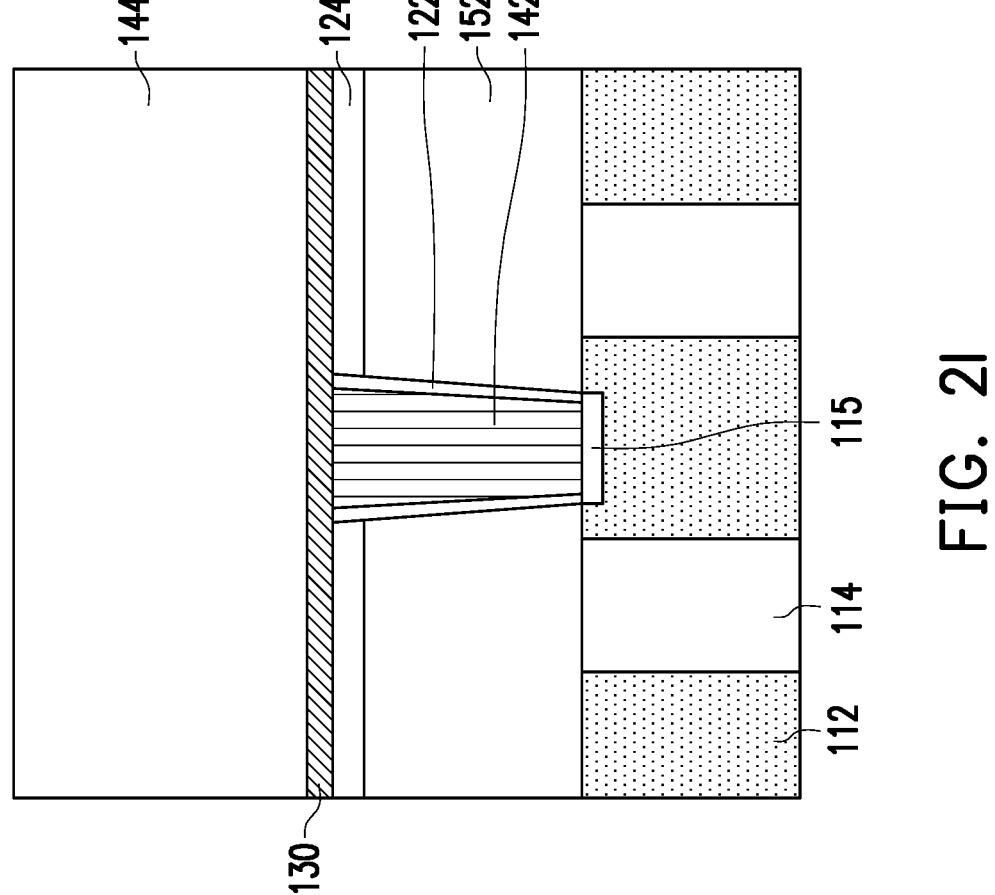

Referring to FIG. 2H and FIG. 3, in the manufacturing step 216, a planarization process such as chemical mechanical polishing (CMP) is then performed to remove recessive portions of the filling material of the conductive via 142, the barrier liner 122 surrounding the conductive via 142, and the hard mask layer 124, such that the top surfaces of the conductive via 142 and the barrier liner 122 are exposed from the hard mask layer 124 as shown in FIG. 2H.

Referring to FIG. 2I and FIG. 3, in the manufacturing step 216, a barrier layer 130 is then deposited on the hard mask layer 124 and the top surfaces of the conductive via 142 and the barrier liner 122. In the present embodiment, the barrier layer 130 may be selectively or non-selectively deposited by ALD or CVD process.

Moreover, a backside contact 144 is then deposited on the barrier layer 130. In the present embodiment, the backside contact 144 may be formed of the conventional metal materials, such as copper. In the present embodiment, a thickness dimension of the backside contact 144 may be in a range from 1 nanometer to 1000 nanometers.

Figures 4A, 4B:
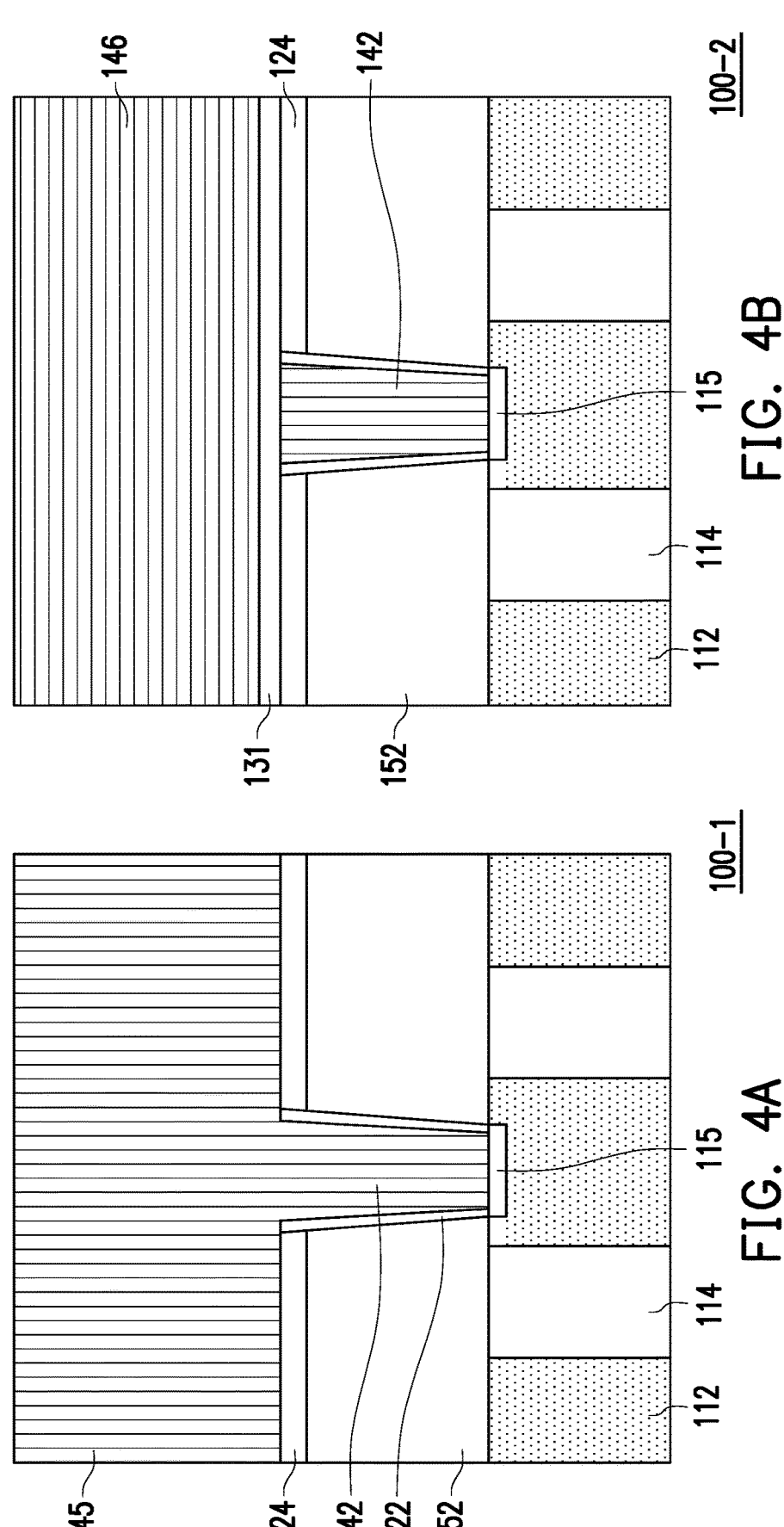
FIG. 4A is a schematic cross-sectional view showing a semiconductor structure in accordance with another embodiment of the disclosure.
FIG. 4B is a schematic cross-sectional view showing a semiconductor structure in accordance with another embodiment of the disclosure.

FIG. 4A is a schematic cross-sectional view showing a semiconductor structure 100-1 in accordance with another embodiment of the disclosure. In the semiconductor structure 100-1, referring to FIG. 4A, the backside contact 144 may be composed of the anisotropic transport material. As shown in FIG. 4A, the backside contact 144 and the conductive via 142 may be integrally formed by filling the same anisotropic transport material, and the backside contact 144 and the conductive via 142 are in direct contact without a barrier layer disposed therebetween.

FIG. 4B is a schematic cross-sectional view showing a semiconductor structure 100-2 in accordance with another embodiment of the disclosure. In accordance with the semiconductor structure 100-2 shown FIG. 4B, in the present embodiment, a backside contact 146 may be formed of a topological material, and the conductive via 142 may be formed of an anisotropic transport material. In the present embodiment, a capping layer 131 is disposed between the backside contact 146 and the conductive via 142. In the present embodiment, the capping layer 131 may be integrated to modulate the resistance between the conductive via 142 and the backside contact 146. In some embodiments, the capping layer 131 may be formed of low resistivity metals, such as Co, Al, Ru, W, Mo, Ta, Cu, Fe, Rh, Ir, Pd, Pt, Ni, and alloys thereof. In the present embodiments the capping layer 131 may be capped by selective or non-selective atomic layer deposition (ALD) and chemical vapor deposition (CVD) processes. In some embodiments, a thickness of the capping layer is in a range from 0.1 nanometer to 30 nanometers.

Referring to FIG. 4A and FIG. 4B, in some embodiments, the anisotropic transport material and the topological material of the conductive via 142 and the backside contacts 145 and 146 may be respectively deposited by physical vapor deposition (PVD), CVD, ALD, plasma-enhanced atomic layer deposition (PE-ALD), and plasma-enhanced chemical vapor deposition (PE-CVD) with a process temperature in a range from 100° C. to 500° C. In other embodiments, the anisotropic transport material and the topological material may be etched by plasma etching, sputter etching, reactive ion etching, and deep-reactive ion etching to form the backside contacts 145, 146 shown in FIG. 4A and FIG. 4B.

In some embodiments, the anisotropic transport material and the topological material of the conductive via 142 may be integrated with transitional metals such as Co, Al, Ru, W, Mo, Ta, Cu, Fe, Rh, Ir, Pd, Pt, Ni, and alloys thereof.

Figures 4C, 4D:
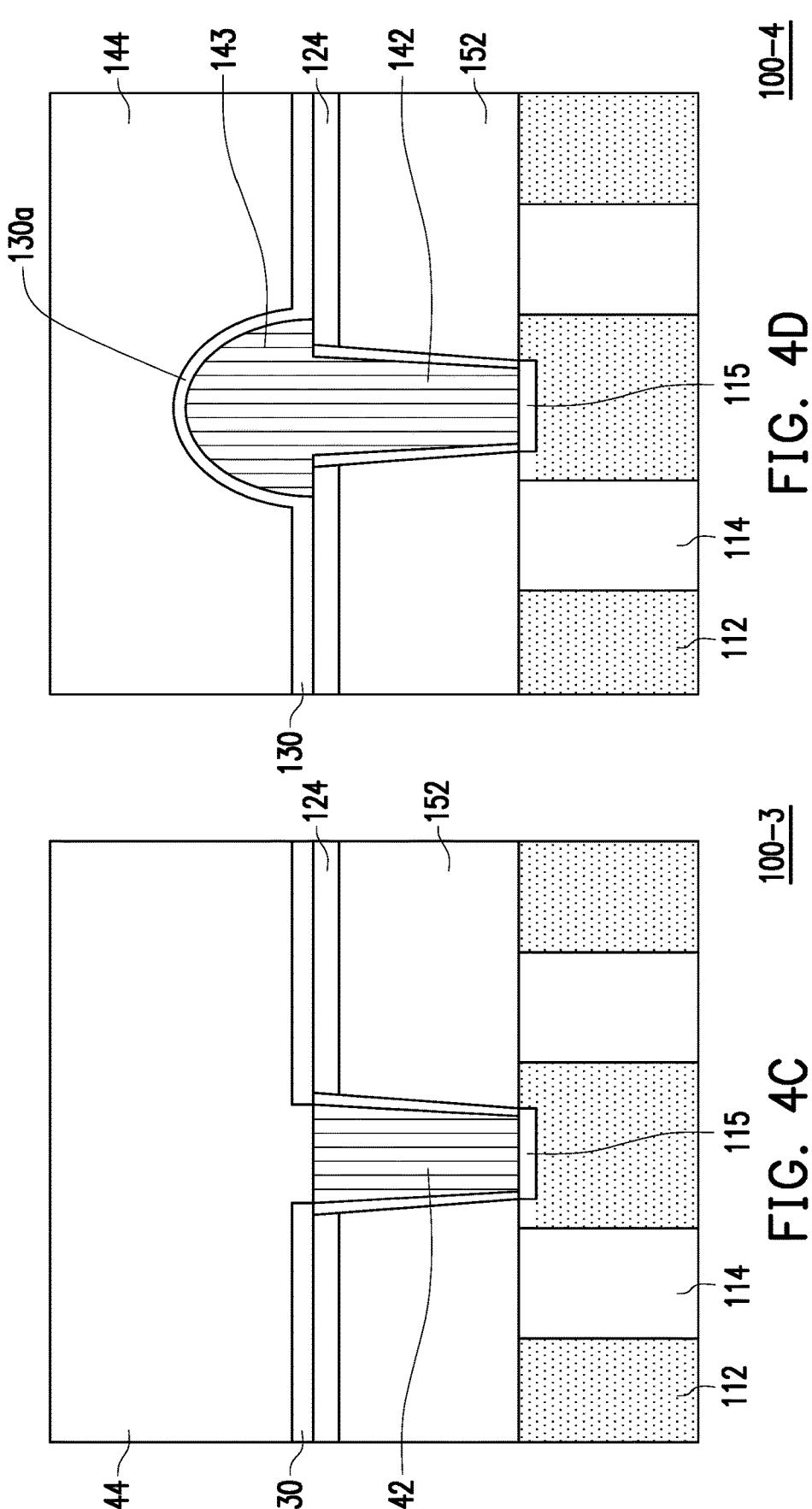
FIG. 4C is a schematic cross-sectional view showing a semiconductor structure in accordance with another embodiment of the disclosure.
FIG. 4D is a schematic cross-sectional view showing a semiconductor structure in accordance with another embodiment of the disclosure.

FIG. 4C is a schematic cross-sectional view showing a semiconductor structure 100-3 in accordance with another embodiment of the disclosure. Referring to the semiconductor structure 100-3 shown in FIG. 4C, the backside contact 144 is formed of a conventional conductive metal, such as copper, and the conductive via 142 is formed of the anisotropic transport material. In the present embodiment, the backside contact 144 may be in direct contact with the conductive via 142 without a barrier layer disposed therebetween. As shown in FIG. 4C, the top surface of the conductive via 142 is exposed from the barrier layer 130 to be in contact with the backside contact 144. That is, a barrier-free interface may be configured between the backside contact 144 and the conductive via 142 to further reduce conductive resistivity therebetween.

FIG. 4D is a schematic cross-sectional view showing a semiconductor structure 100-4 in accordance with another embodiment of the disclosure. Referring to the semiconductor structure 100-4 shown in FIG. 4D, in some embodiments, the conductive via 142 may include a protrusion portion 143 protruding toward the back contact 144. In the present embodiment, barrier layers 130, 130a may be disposed between the protrusion portion 143, the hard mask layer 125, and the back contact 144. In the present embodiment, through configuration of the protrusion portion 143, the contact area between the conductive via 142 and the back contact 144 can be increased to reduce conductive resistivity and to enhance transport of the charge therebetween.

Figure 5A:
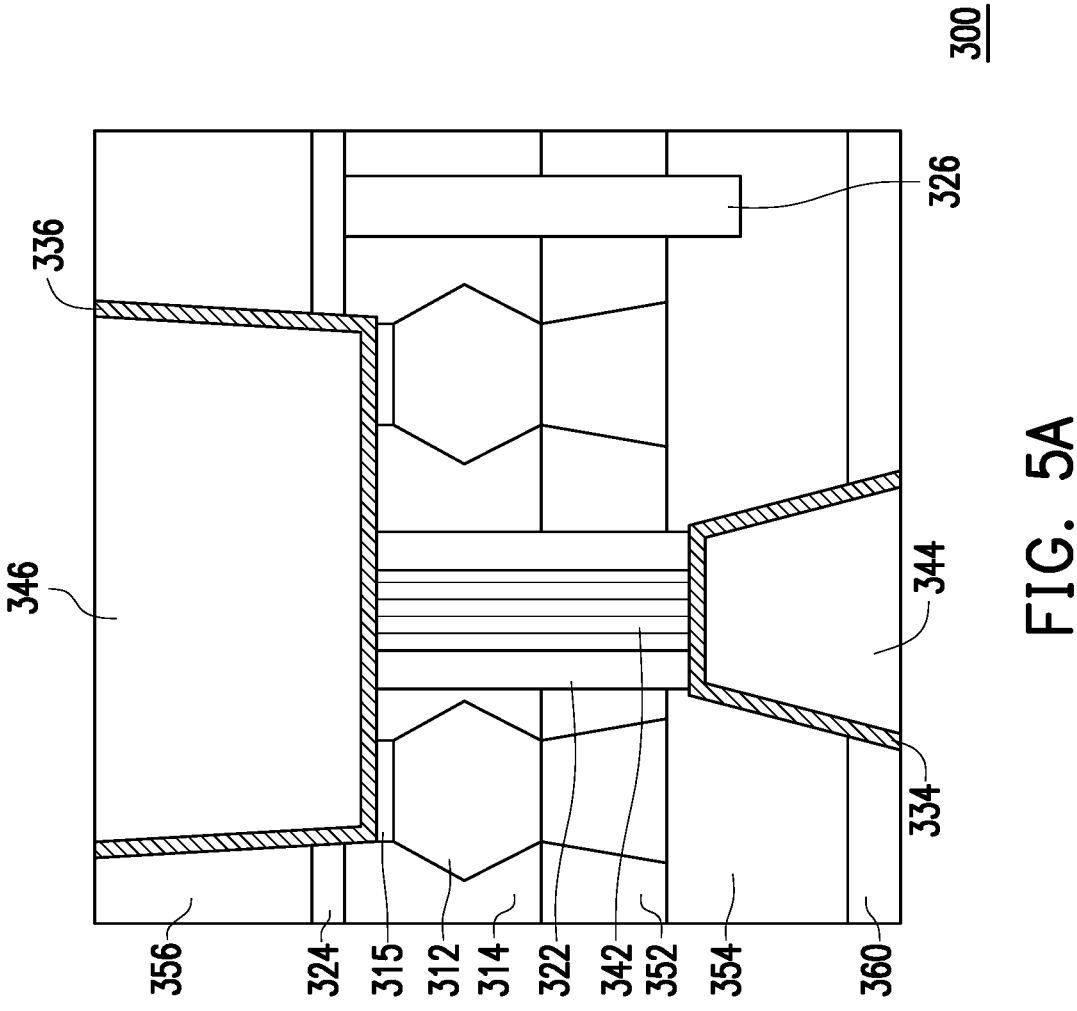
FIG. 5A and FIG. 5B are schematic cross-sectional views showing a semiconductor structure in accordance with an embodiment of the disclosure.
Figure 5B:
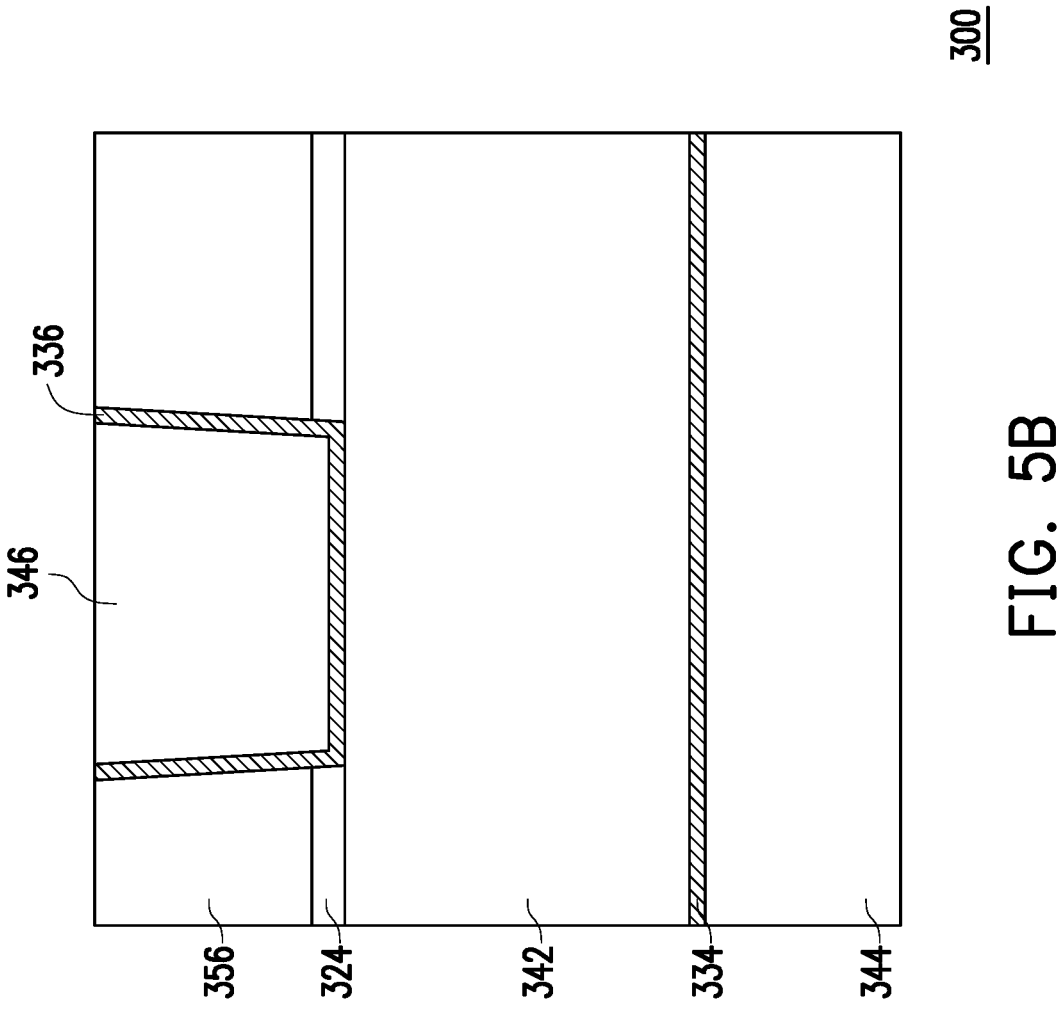

FIG. 5A and FIG. 5B are schematic cross-sectional views showing a semiconductor structure 300 in accordance with an embodiment of the disclosure. In the present embodiment, FIG. 5A is the cross-sectional view of the semiconductor structure 300 along a X-direction, and FIG. 5B is the cross-sectional view of the semiconductor structure 300 along a Y-direction. Referring to FIG. 5A and FIG. 5B, in the present embodiment, the semiconductor structure 300 may include a substrate 352, a first dielectric layer 356, a plurality of source/drain (S/D) regions 312, a first contact 346, a second dielectric layer 354, a second contact 344, and a conductive via 342.

In the present embodiment, the first dielectric layer 356 is disposed over the substrate 352. The S/D regions 312 are disposed in the substrate 352 including a dielectric layer 314. As shown in FIG. 5A, the first contact 346 penetrates through the first dielectric layer 356 to electrically connect to the S/D regions 312. The second dielectric layer 354 is disposed below the S/D regions 312 and the substrate 352 and the S/D regions 312. In some embodiments, silicide layers 315 may be formed between the S/D regions 112 and the first contact 346.

As shown in FIG. 5A, the second contact 344 penetrates through the second dielectric layer 354, and the conductive via 342 penetrates through the substrate 352 to electrically connect the first contact 346 and the second contact 344. In the present embodiment, the conductive via 342 may include the anisotropic transport material or the topological material. For example, as shown in FIG. 5A, the conductive via 342 includes the anisotropic transport material but not limited thereto, depending on requirements of different applications, different materials such as the topological material can be also applied to form the conductive via 342. As shown in FIG. 5A, a barrier liner 322 is disposed around the conductive via 342. In addition, a barrier layers 336 and 334 are respectively disposed to surround the first contact 346 and the second contact 344.

In some embodiments, referring to FIG. 5A and FIG. 5B, the semiconductor structure 300 may include a cutting metal gate 326 laterally disposed aside the S/D regions 312 and the conductive via 342. In the present embodiment, an etching stop layer 324 may be disposed between the first dielectric layer 356 and the dielectric layer 314. In addition, as shown in FIG. 5A, a hard mask layer 360 is disposed on the second dielectric layer 354.

Figures 6A, 6B:
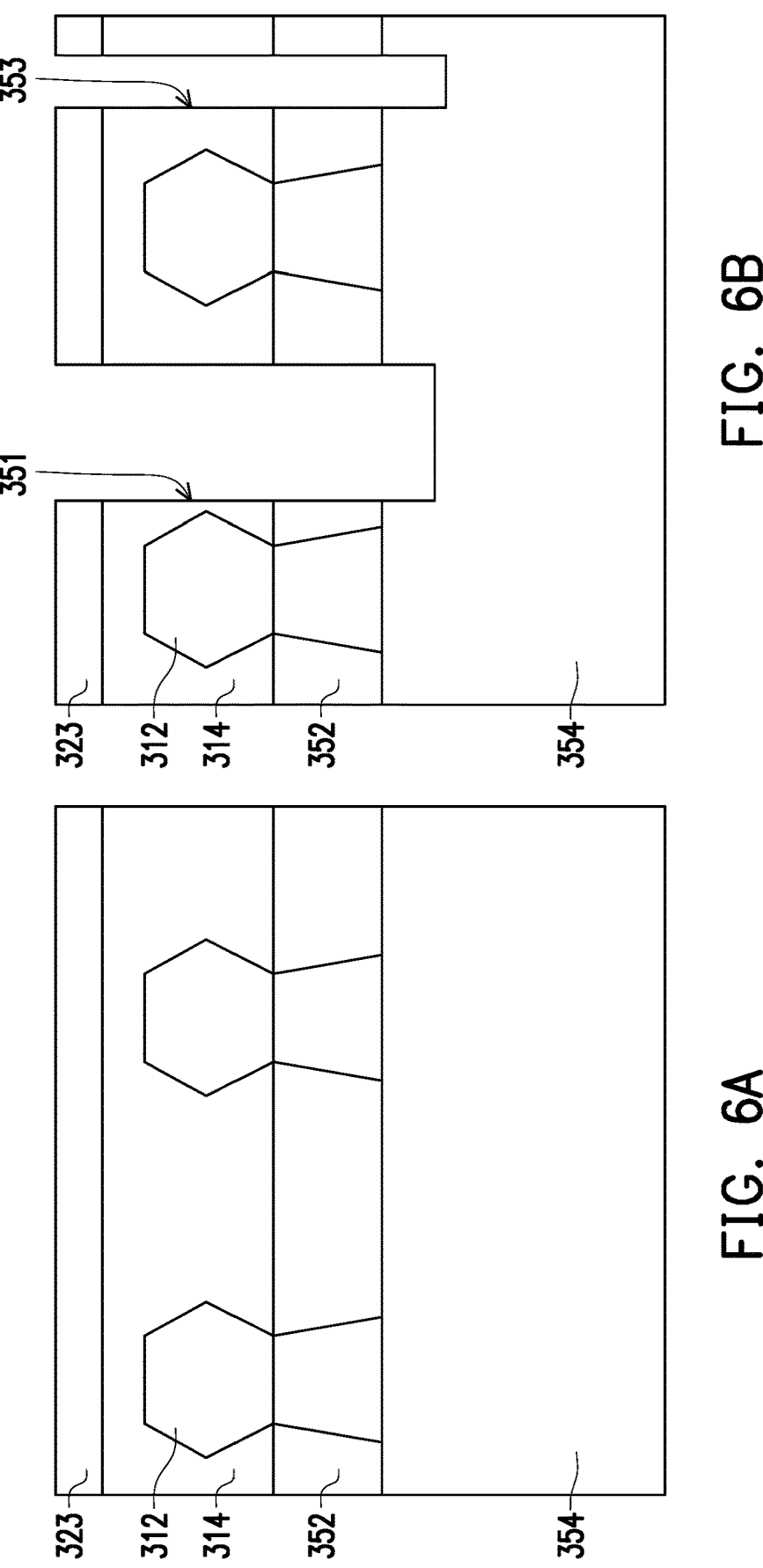
FIG. 6A to FIG. 6M are schematic cross-sectional views illustrating a method of forming a semiconductor structure according to an embodiment of the disclosure.

FIG. 6A to FIG. 6J are schematic cross-sectional views illustrating a method of forming the semiconductor structure 300 according to an embodiment of the disclosure. FIG. 7 is a flowchart of a method for forming the semiconductor structure 300 according to various aspects of the present disclosure. Referring to FIG. 6A and FIG. 7, in the manufacturing step 402, the substrate 352 including a dielectric layer 314 is provided. As shown in FIG. 6A, the substrate 352 has the second dielectric layer 342 disposed therebelow and the S/D regions 312 disposed therein. In the present embodiment, a hard mask layer 323 is disposed above the substrate 352. Referring to FIG. 6B and FIG. 7, in the manufacturing step 404, via holes 341, 343 for forming the conductive via 342 and the cutting metal gate 326 are respectively formed. As shown in FIG. 6B, the via holes 341, 343 penetrate through the hard mark layer 323, the substrate 352, and extend into the second dielectric layer 354.

Figures 6C, 6D:
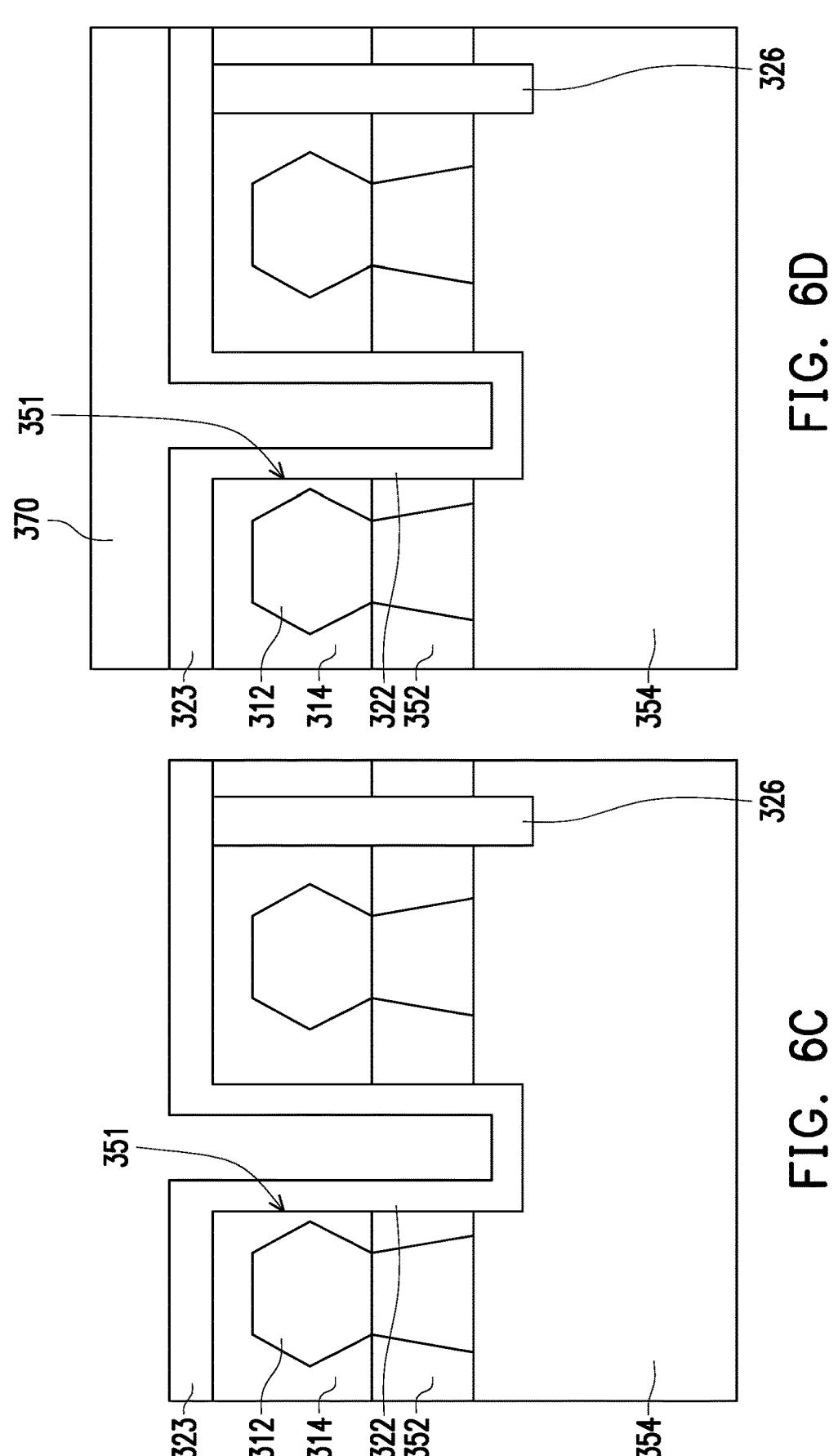

Referring to FIG. 6C and FIG. 7, in the manufacturing step 406, the via holes 351 and 353 are respectively deposited and filled with the dielectric materials such as silicon nitride (SiN) therein. In the present embodiment, the depositing material of the via hole 351 and the filling material of the via hole 353 are the same with the material of the hard mask layer 323, for example, SiN. As shown in FIG. 6C, a barrier liner 322 is then formed on the side wall of the via hole 351 after depositing the dielectric material.

Figures 6E, 6F:
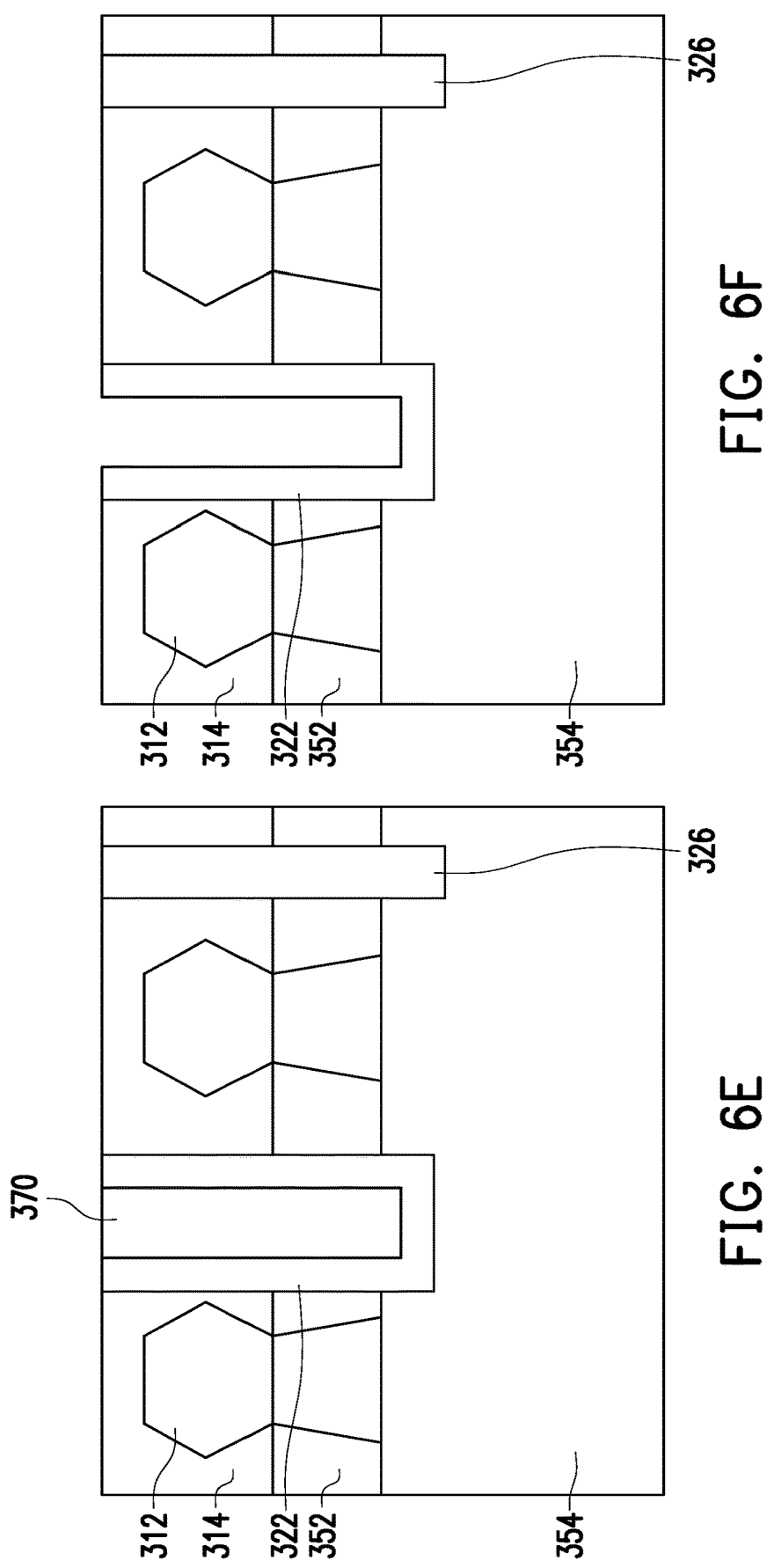

Referring to FIG. 6D and FIG. 7, in the manufacturing step 408, an oxide material 370 such as silicon oxide is then further filled into the via hole 351. Referring to FIG. 6E and FIG. 7, in the manufacturing process of the step 410, a planarization process, for example a CMP process, is applied to the hard mask layer 323 and the oxide material 370 for removing the excessive portions thereof. Referring to FIG. 6F and FIG. 7, in the manufacturing process of the step 410, the oxide material 370 inside of the via hole 351 is then removed for filling a conductive material.

Figures 6G, 6H:
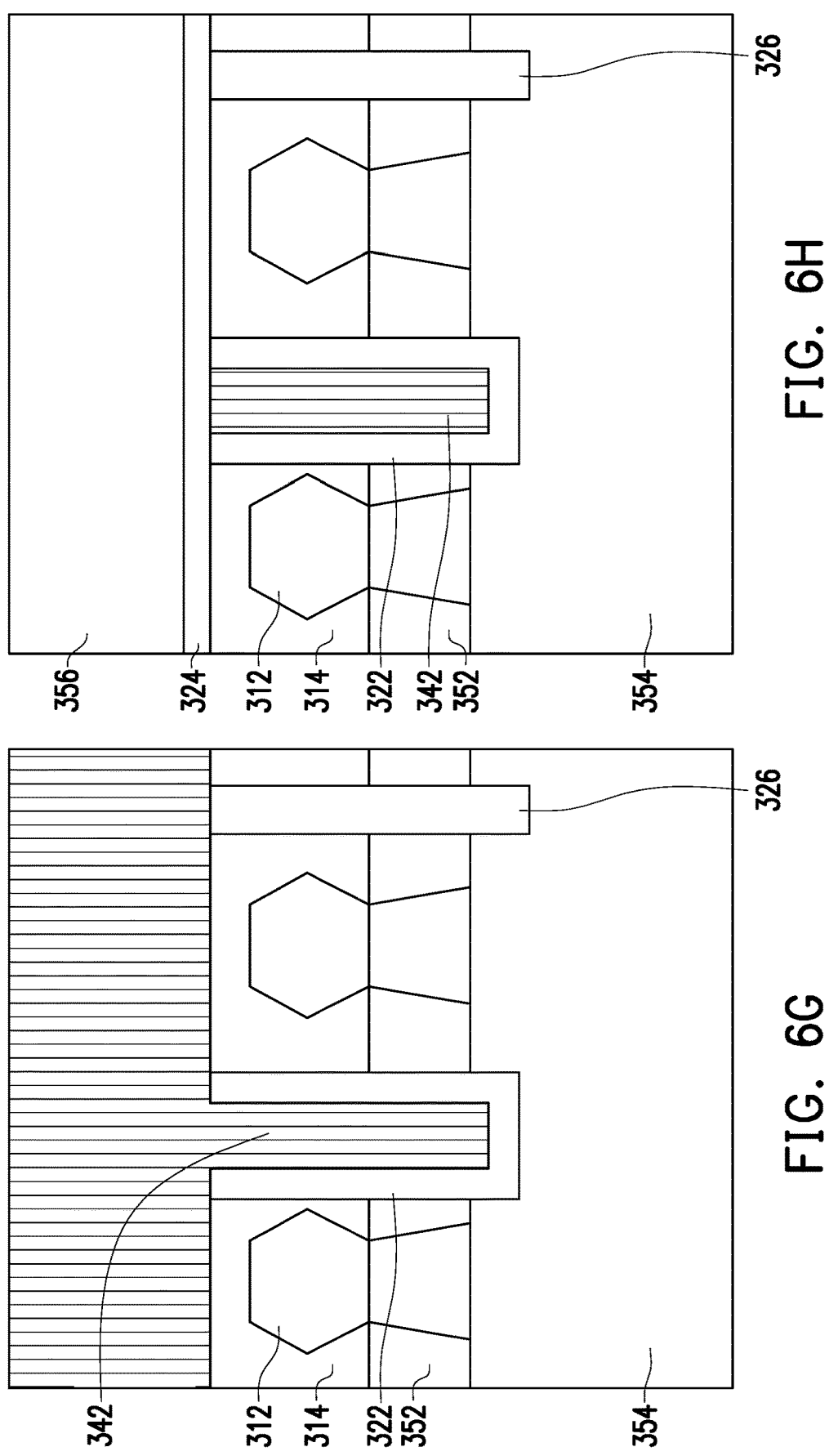

Referring to FIG. 6G and FIG. 7, in the manufacturing step 412, the conductive materials, for example, the anisotropic transport material or the topological material is filled in the via hole 351. In the present embodiment, the anisotropic transport material is filled in the via hole 351 and excessively deposited above the substrate 352 and the S/D regions 312.

Referring to FIG. 6H and FIG. 7, in the manufacturing step 414, the excessive portion of the anisotropic transport material deposited above the substrate 352 and the S/D regions 312 is removed. In addition, an etching stop layer (ESL) 324 and the first dielectric layer 356 are then deposited above the substrate 352 and the S/D regions 312. In the present embodiment, the ESL 324 may be composed of metal nitrides, such as TlN, AlN, metal oxides, such as $SiO_x$, $Si_xO_yC_z$, $AlO_x$, WC, and the related materials. In some embodiments, the ESL 324 may be single layer or multiple layers. In the present embodiment, the ESL may be deposited by ALD, CVD, PE-ALD, PE-CVD, and PVD processes.

Figures 6I, 6J:
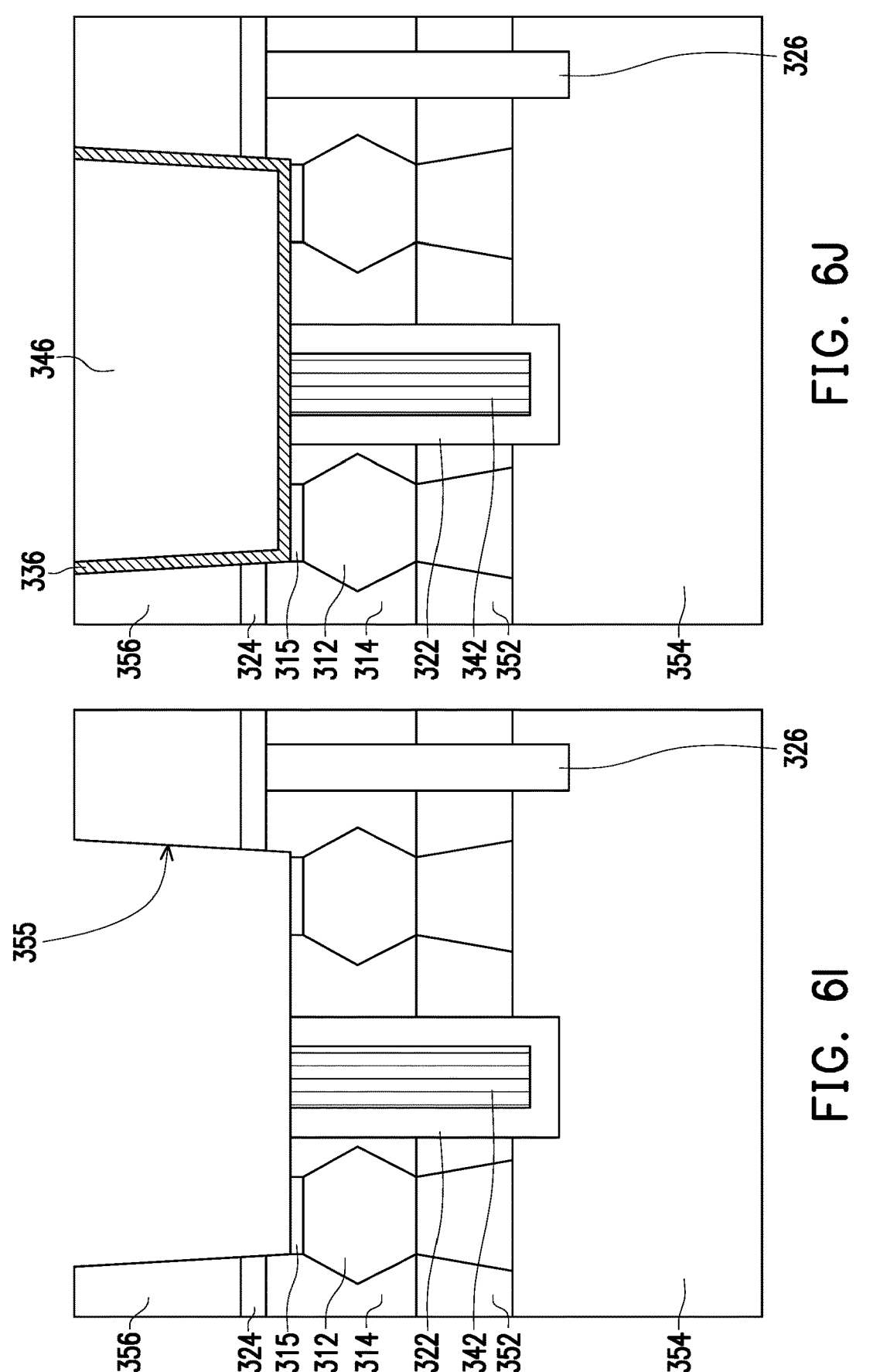

Referring to FIG. 6I and FIG. 7, in the manufacturing step 416, the first dielectric layer 356 and the ESL 324 are etched to form a trench 355 and to expose the conductive via 342 and the silicide layers 315 disposed on the S/D regions 112.

Figure 6K:
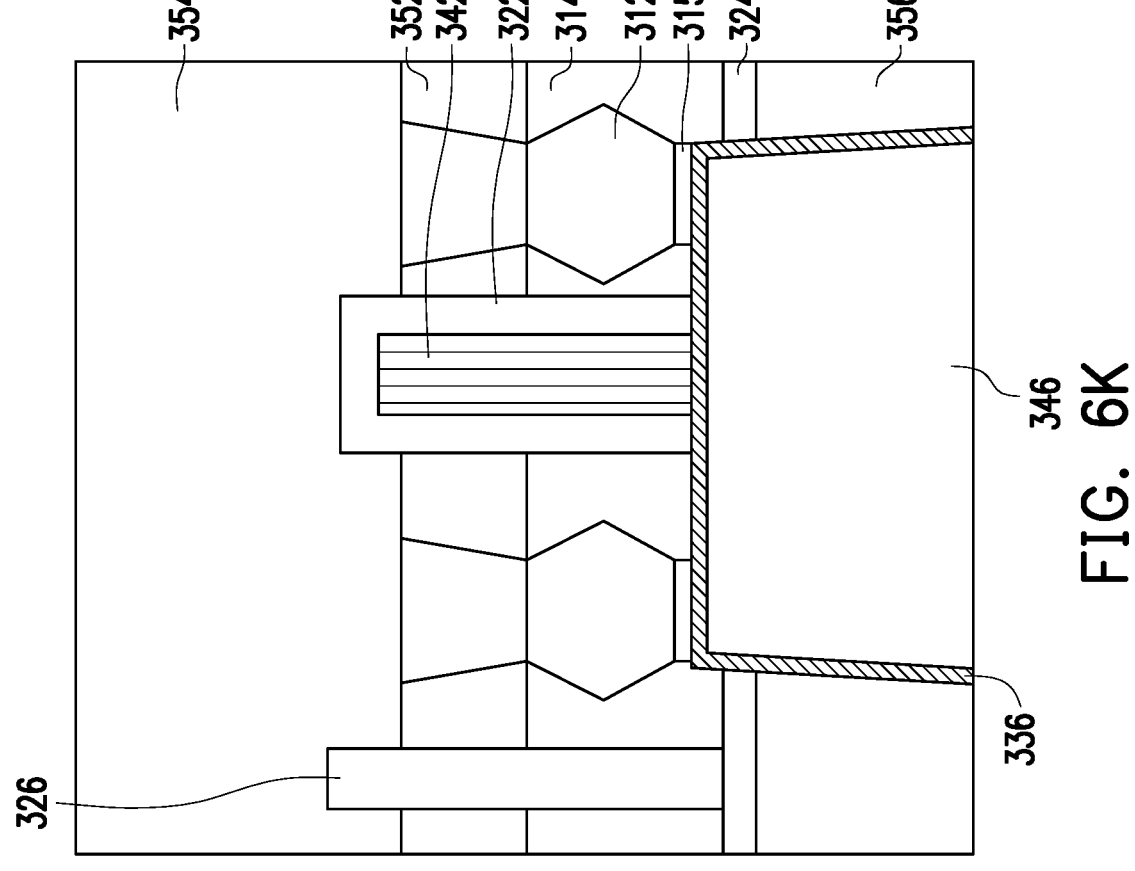

Referring to FIG. 6J and FIG. 7, in the manufacturing step 418, a dielectric layer may be deposited on the sidewalls and bottom of the trench 355 to form the barrier layer 336. Subsequently, a metal conductive material is filled into the trench 355 to form the second connect 346. Referring to FIG. 6K and FIG. 7, in the manufacturing step 420, the semiconductor structure formed in the above steps is further flipped for thinning down the second dielectric layer 354.

Figures 6L, 6M:
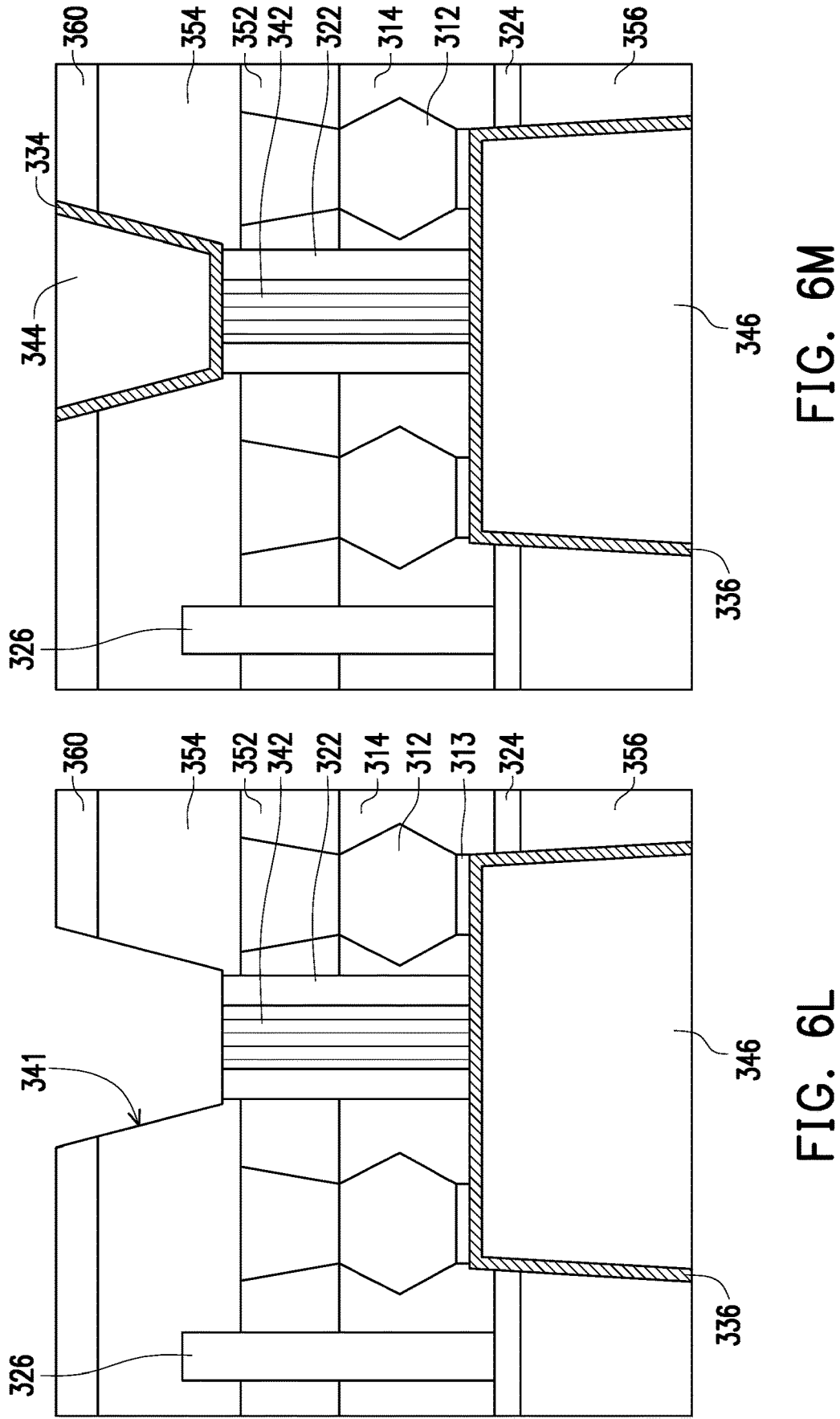

Referring to FIG. 6L and FIG. 7, in the manufacturing step 422, a hard mask layer 360 is deposited on a top surface of the second dielectric layer 354 thinned down in the previous step. A trench 341 is subsequently formed to penetrate the hard mask layer 360 and the second dielectric layer 354, and top surfaces of the conductive via 342 and the barrier liner 322 are exposed in the trench 341. Referring to FIG. 6M and FIG. 7, in the manufacturing step 424, the barrier layer 334 is deposited on sidewalls and a bottom surface of the trench 341. Moreover, a conductive material, such as copper, is then filled into the trench 341 to form the second contact 344.

Figures 8A, 8B:
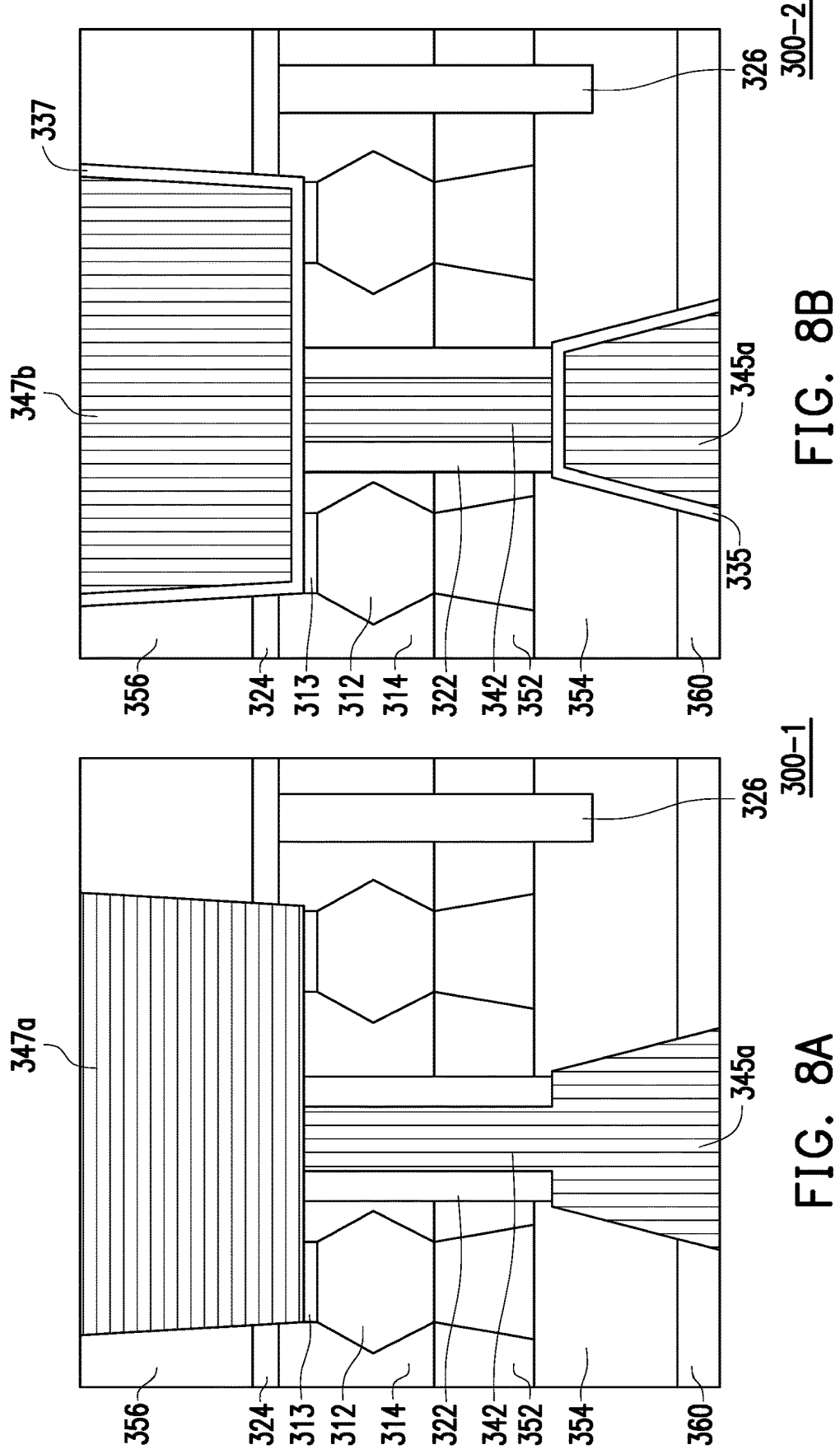
FIG. 8A is a schematic cross-sectional view showing a semiconductor structure in accordance with another embodiment of the disclosure.
FIG. 8B is a schematic cross-sectional view showing a semiconductor structure in accordance with another embodiment of the disclosure.

FIG. 8A is a schematic cross-sectional view showing a semiconductor structure 300-1 in accordance with another embodiment of the disclosure. Referring to the semiconductor structure 300-1 in FIG. 8A, in some embodiments, the trench 355 shown in FIG. 6L may be filled with the topological material to form a first contact 347a. In the present embodiment, a second contact 345a and the conductive via 342 may be integrally formed of the same material, for example, the anisotropic transport material.

FIG. 8B is a schematic cross-sectional view showing a semiconductor structure 300-2 in accordance with another embodiment of the disclosure. Referring to the semiconductor structure 300-2 in FIG. 8B, in the present embodiment, the first contact 347b, the conductive via 342, and the second contact 345b may be formed by filling the same material, for example, the anisotropic transport material. In the present embodiment, capping layers 337 and 335 may be respec tively disposed to surround the first contact 347b and the second contact 345b. In the present embodiment, the capping layers 337 and 335 are configured to modulate the contact resistance between the conductive via 342 and the first contact 347b and between the conductive via 342 and the second contact 345b.

Figures 8C, 8D:
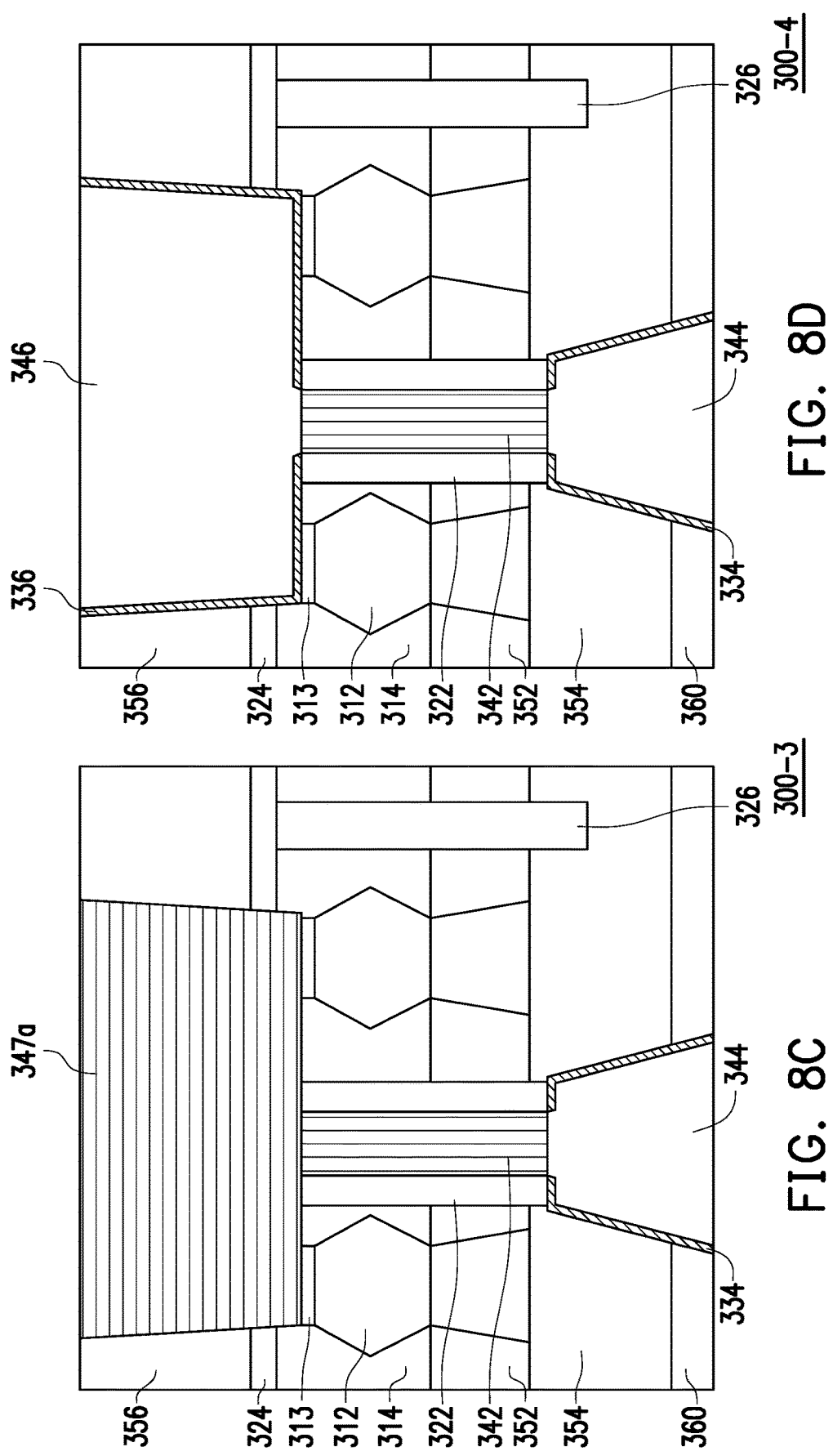
FIG. 8C is a schematic cross-sectional view showing a semiconductor structure in accordance with another embodiment of the disclosure.
FIG. 8D is a schematic cross-sectional view showing a semiconductor structure 300-4 in accordance with another embodiment of the disclosure.

FIG. 8C is a schematic cross-sectional view showing a semiconductor structure 300-3 in accordance with another embodiment of the disclosure. Referring to the semiconductor structure 300-3 in FIG. 8C, in some embodiments, the conductive via 342, the first contact 347b, and the second contact 345b may be all formed of different materials. For example, as shown in FIG. 8C, the first contact 347a is formed of the topological material, the second contact 344 is formed of a conventional metal material, for example, copper, and the conductive via 342 is formed of the anisotropic transport material.

FIG. 8D is a schematic cross-sectional view showing a semiconductor structure 300-4 in accordance with another embodiment of the disclosure. Referring to the semiconductor structure 300-4, in the present embodiments, both the first contact 346 and the second contact 344 are formed of the conventional metal materials, such as copper. As shown in FIG. 8D, the conductive via 342 may be formed of the anisotropic transport material, and barrier-free interfaces may be disposed between the conductive via 342 and the first contact 346 and between the conductive via 342 and the second contact 346. In the present embodiment, the top and bottom ends of the conductive via 342 are respectively exposed from the barrier layers 336, 334 to reduce the conductive resistivity between the conductive via 342 and the first contact 346 and between the conductive via 342 and the second contact 344.

Figure 9:
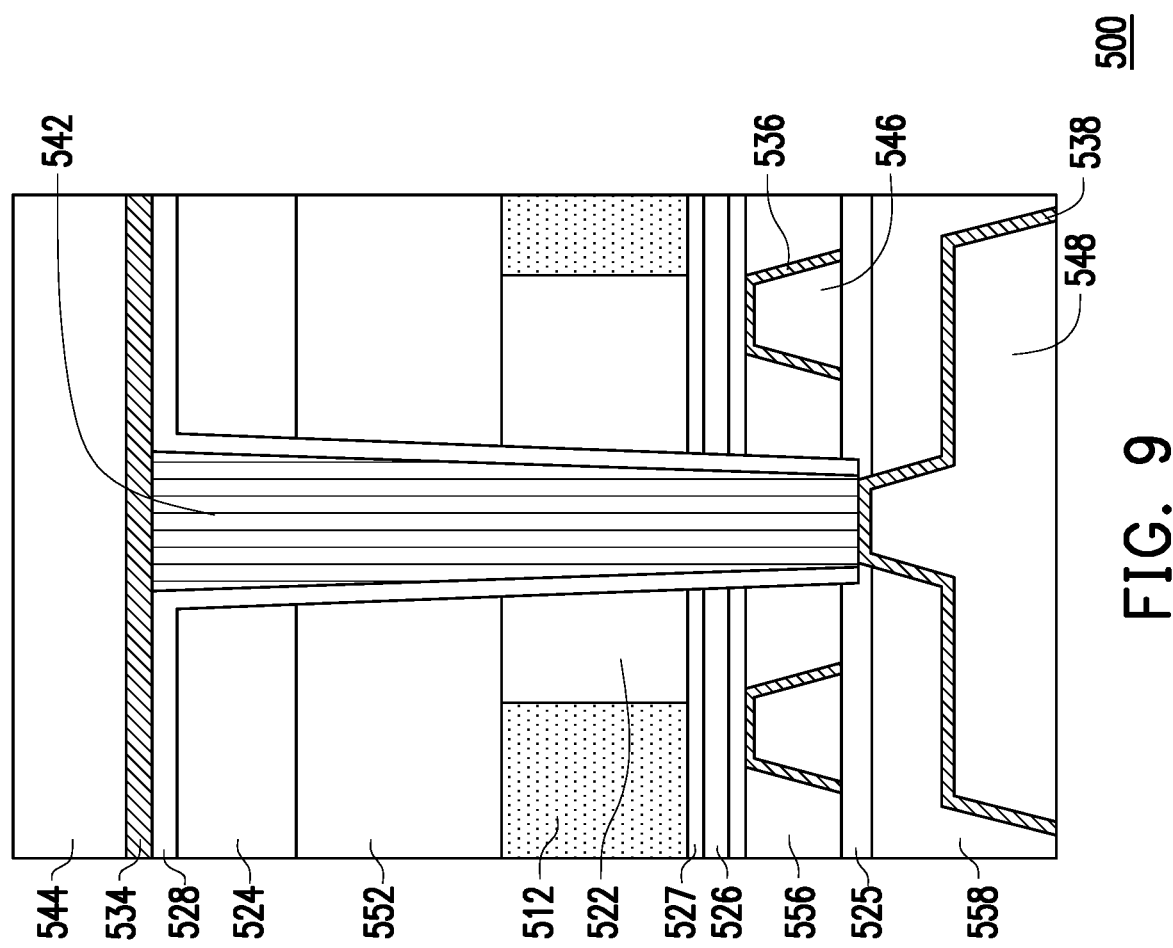
FIG. 9 is a schematic cross-sectional view showing a semiconductor structure in accordance with an embodiment of the disclosure.

FIG. 9 is a schematic cross-sectional view showing a semiconductor structure 500 in accordance with an embodiment of the disclosure. The difference between the present embodiment and the above embodiments is that the present embodiment may further include a third contact 546 disposed between the first contact 544 and the second contact 548 and aside a conductive via 542.

Specifically, in the present embodiment, the semiconductor structure 500 includes a substrate having a first dielectric layer 552, a plurality of S/D regions 512, and a cutting metal gate 522. In addition, the semiconductor structure 500 includes a hard mask layer 524, a second dielectric layer 558, the first contact 544, the second contact 548, and the conductive via 542. Referring to FIG. 9, the S/D regions 512 are disposed aside the cutting metal gate 522. In addition, the first contact 544 and the first dielectric layer 552 are disposed above the S/D regions 512, and as shown in FIG. 9, the hard mask layer 524 is disposed between the first contact 544 and the first dielectric layer 552. The second dielectric layer 558 and the second contact 548 are disposed below the S/D regions 512 and the cutting metal gate 522, and the second contact 548 penetrates through the second dielectric layer 558 for being in contact with the conductive via 542.

In the present embodiment, the semiconductor structure 500 may further include a third dielectric layer 556 and a third contact 546, and the third contact 546 penetrates through the dielectric layer 556. In some embodiments, as shown in FIG. 9, a barrier layer 534 is disposed between the first contact 544 and the hard mask layer 524, and the second contact 548 and the third contact 546 are respectively surrounded by the barrier layers 536, 538. In the present embodiment, a pair of first barrier liners 527 with an oxide layer 526 disposed therebetween may be disposed between the S/D regions 512 and the third dielectric layer 556, and a second barrier liner 528 may be disposed between the first contact 544 and the hard mask layer 524. Moreover, a third barrier liner 525 may be disposed between the second dielectric layer 558 and the third dielectric layer 556.

In accordance with FIG. 9, in the present embodiment, the first contact 544 and the second contact 548 may be made of a conventional conductive metal material such as copper, and the conductive via 542 electrically connects the first contact 544 and the second contact 548. As shown in FIG. 9, the conductive via 542 penetrates through the hard mask layer 524, the first dielectric layer 552, and the cutting metal gate 522, and the S/D regions 512 are disposed aside the conductive via 542. In the present embodiment, the cutting metal gate 522 is made of, for example, SiCN, but not limited thereto, and the first dielectric layer 522 may be made of a silicon layer.

Figure 10B:
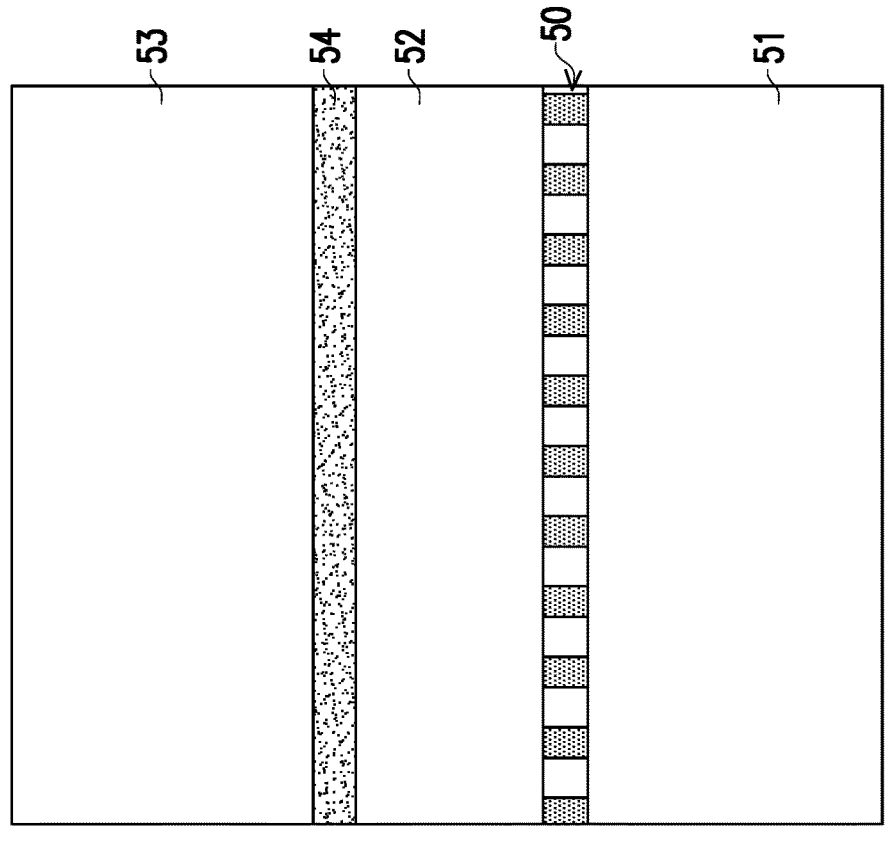
FIG. 10A to FIG. 10F are schematic cross-sectional views illustrating a method of forming a semiconductor structure according to an embodiment of the disclosure.
Figure 10A:
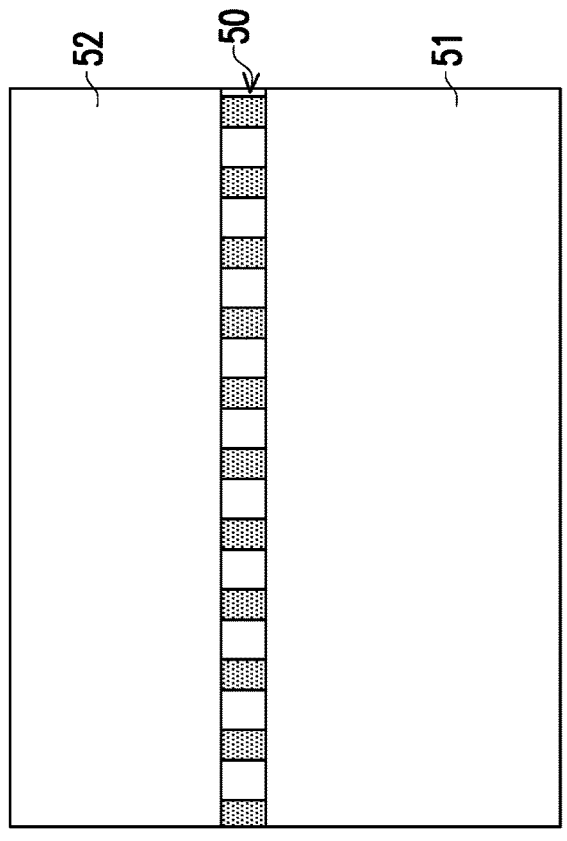

FIG. 10A to FIG. 10F are schematic cross-sectional views illustrating a method of forming the semiconductor structure 500 according to an embodiment of the disclosure. FIG. 11 is a flowchart of a method for forming the semiconductor structure 500 according to various aspects of the present disclosure. Referring to FIG. 10A and FIG. 11, in the manufacturing step 602, a substrate 52 having an interconnect structure 50 disposed thereon is disposed on a dielectric layer 51.

Figures 10C, 10D:
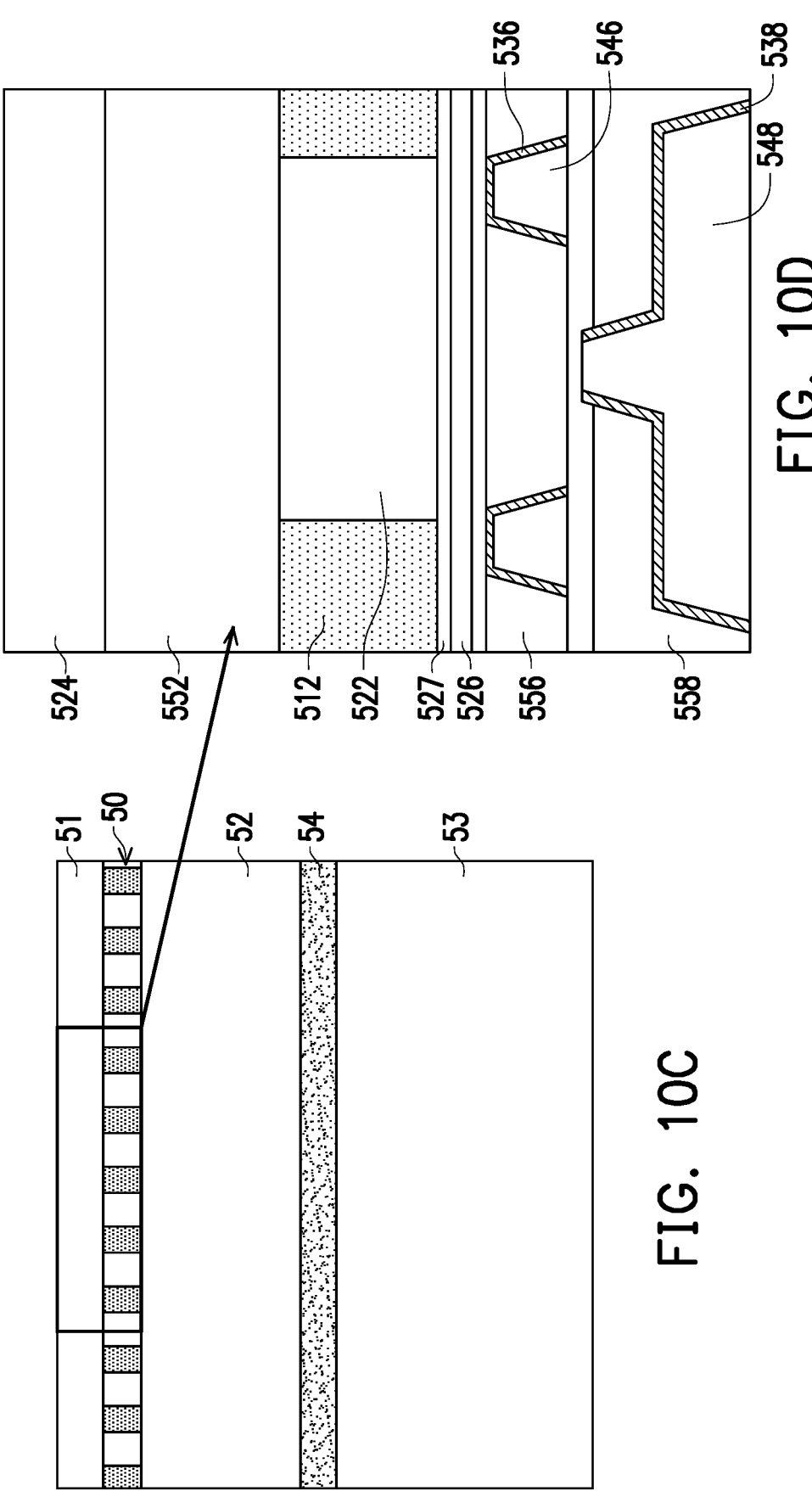

Referring to FIG. 10B and FIG. 11, in the manufacturing step 604, the carrier 53 is attached to a back side of the substrate 52 through an adhesion layer 54. Referring to FIG. 10C and FIG. 11, in the manufacturing step 606, the substrate 52 is flipped for thinning down the dielectric layer 51 to form the first dielectric layer 552 as shown in FIG. 10D. Referring to FIG. 10D and FIG. 11, FIG. 10D illustrates an enlargement of a portion of the FIG. 10C. Referring to FIG. 10D, in the step 608 of FIG. 11, a hard mask layer 524 is then deposited above the dielectric layer 552.

Figures 10E, 10F:
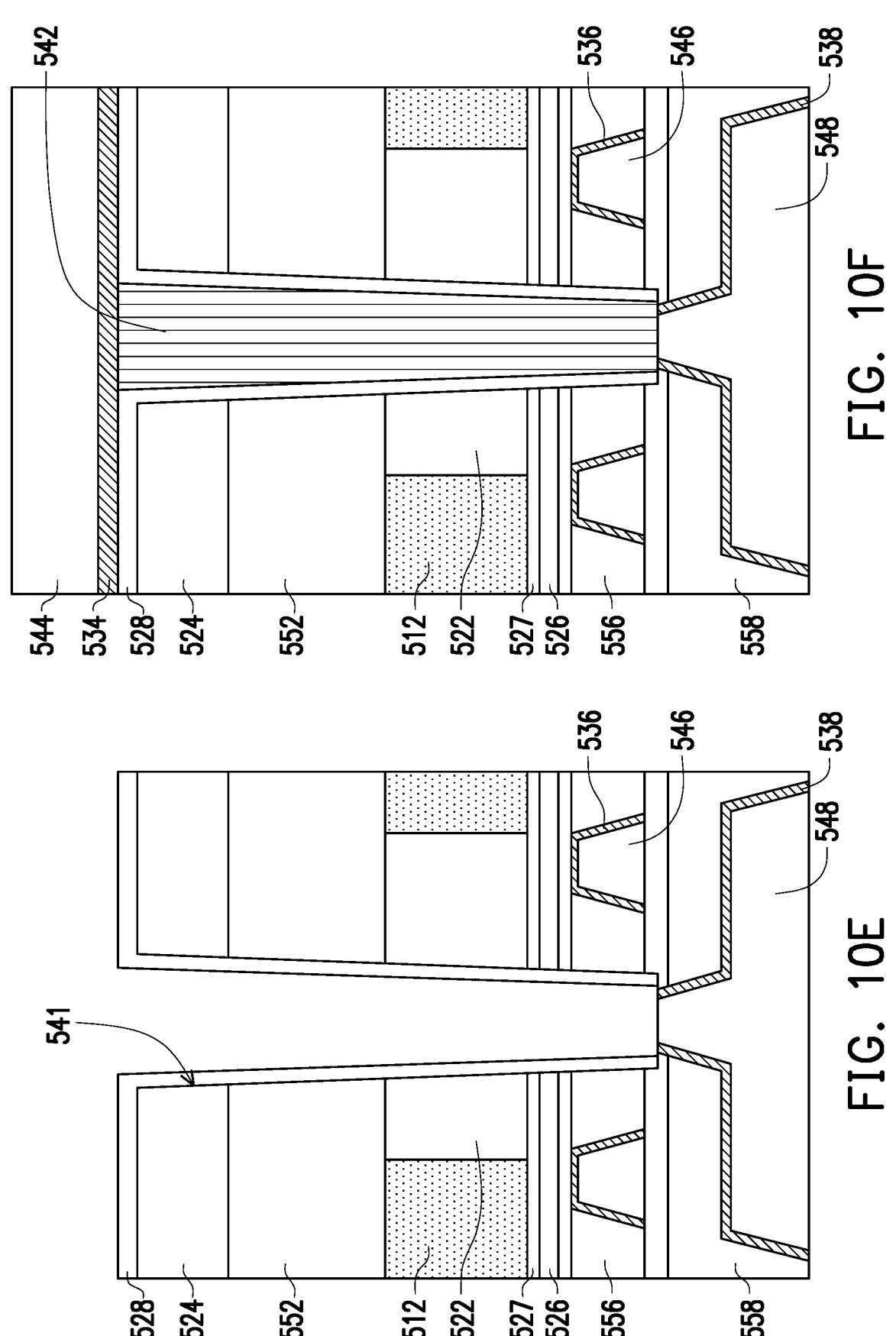

Referring to FIG. 10E and FIG. 11, in the manufacturing step 610, a via hole 541 is formed to penetrate the hard mask layer 524, the first dielectric layer 552, and the cutting metal gate 522 to expose a top surface of the second contact 548. As shown in FIG. 10E, a second barrier liner 528 is formed on the side walls of the via hole 541. Referring to FIG. 10F and FIG. 11, in the manufacturing step 612, the anisotropic transport material is filled in the via hole 541 to form the conductive via 542. Moreover, a first contact 544 is then deposited above the conductive via 542, and the barrier layer 534 is deposited between the first contact 544 and the conductive via 542.

Figures 12A, 12B:
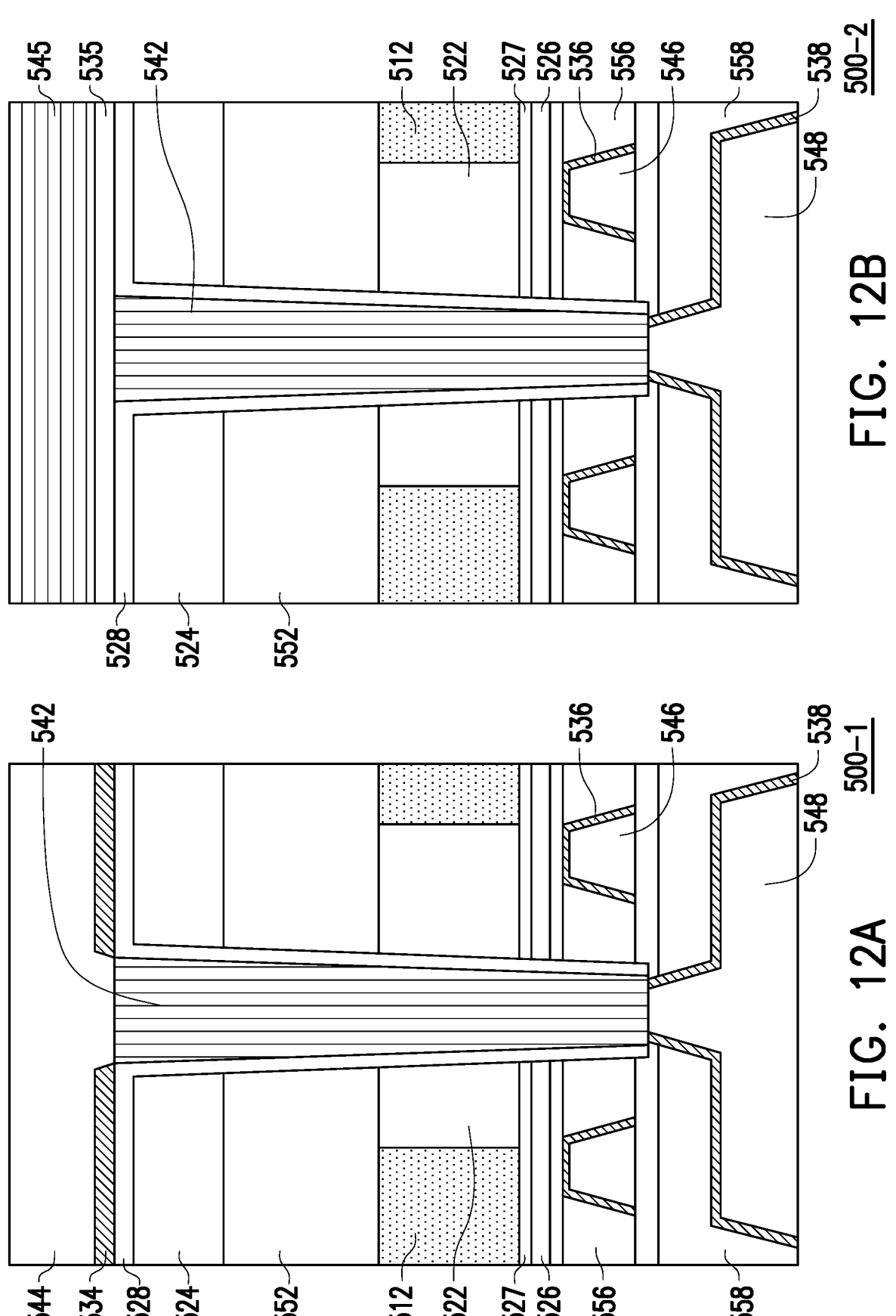
FIG. 12A is a schematic cross-sectional view showing a semiconductor structure in accordance with another embodiment of the disclosure.
FIG. 12B is a schematic cross-sectional view showing a semiconductor structure in accordance with another embodiment of the disclosure.

FIG. 12A is a schematic cross-sectional view showing a semiconductor structure 500-1 in accordance with another embodiment of the disclosure. In the present embodiments, a barrier-free interface is disposed between the first contact 544 and the conductive via 542 for exposing a top surface of the conductive via 542 from the barrier layer 534 to form direct contact between the first contact 544 and the conductive via 542. In the present embodiment, through the direct contact between the first contact 544 and the conductive via 542, the conductive resistivity between the first contact 544 and the conductive via 542 can be further reduced. In the present embodiment, both the first contact 544 and the second contact 548 may be formed of the convention conductive metal material, such as copper, and the conductive via 542 may be formed of the anisotropic transport material.

FIG. 12B is a schematic cross-sectional view showing a semiconductor structure 500-2 in accordance with another embodiment of the disclosure. In the present embodiment, a first contact 545 formed of the topological material may be disposed above the conductive via 542. In the present embodiment, a capping layer 535 is disposed between the first contact 545 and the conductive via 542. In the present embodiment, the capping layer 535 may be integrated to modulate the resistance between the conductive via 542 and the first contact 545.

Figures 12C, 12D:
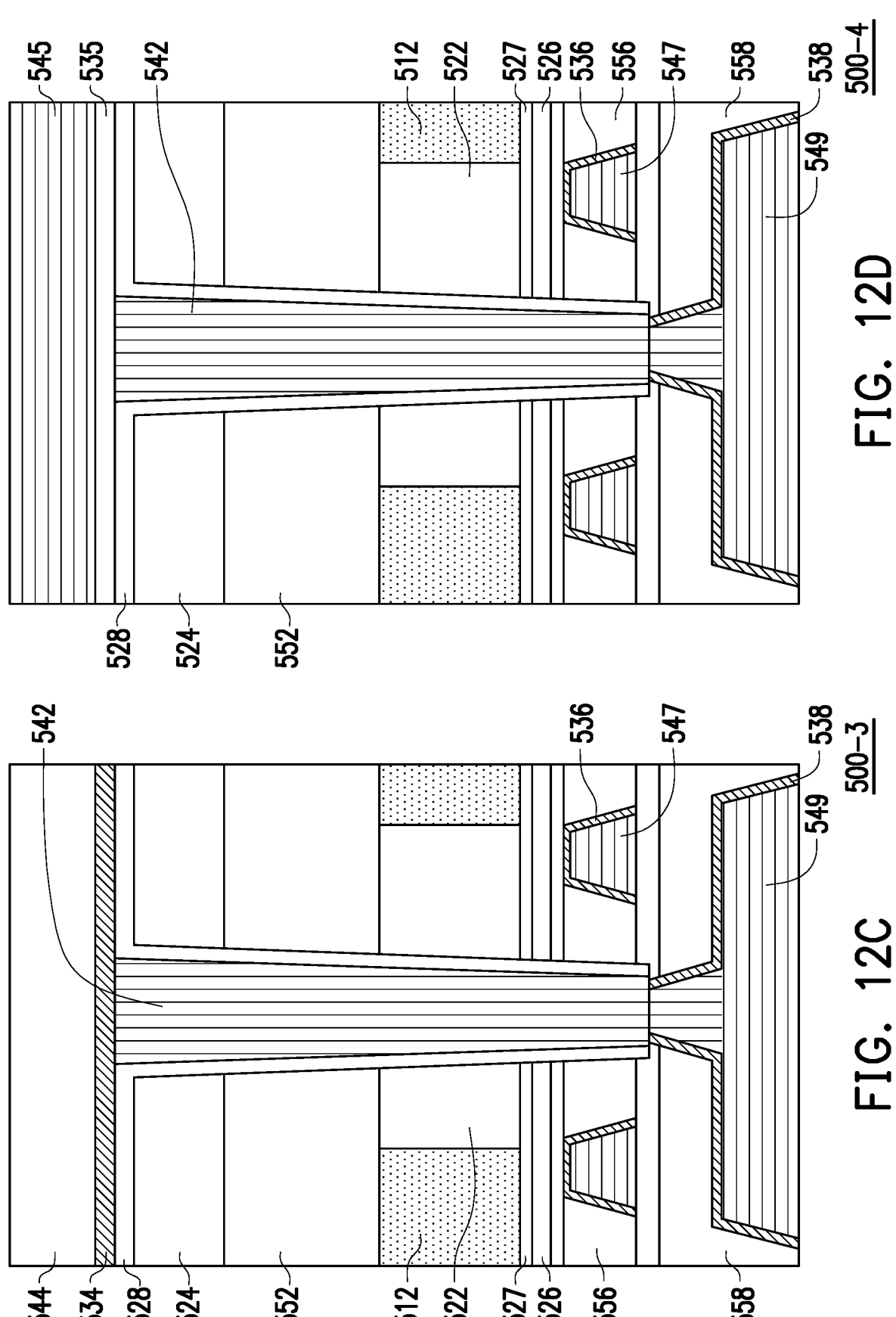
FIG. 12C is a schematic cross-sectional view showing a semiconductor structure in accordance with another embodiment of the disclosure.
FIG. 12D is a schematic cross-sectional view showing a semiconductor structure in accordance with another embodiment of the disclosure.

FIG. 12C is a schematic cross-sectional view showing a semiconductor structure 500-3 in accordance with another embodiment of the disclosure. In the present embodiment, the conductive via 542 and the upper portion of the second contact 549 are integrally formed of the same material, for example, the anisotropic transport material. In the present embodiment, the lower portion of the second contact 549 may be formed of the topological material. Namely, in the present embodiment, different portions of the second contact 549 may be respectively formed of the anisotropic transport material and the topological material. In the present embodiment, the first contact 544 may be formed of a conventional conductive metal material such as copper, and the third contact 547 may be formed of the topological material.

FIG. 12D is a schematic cross-sectional view showing a semiconductor structure 500-4 in accordance with another embodiment of the disclosure. In accordance with the present embodiment, the conductive via 542 and the upper portion 549 of the second contact 549 are both formed of the same material, for example, the anisotropic transport material, and the topological material may be applied to form the lower portion of the second contact 549. In the present embodiment, the topological material may be also applied to form the first contact 545 disposed above the hard mask layer 524. In the present embodiment, the capping layer 535 may be disposed between the first contact 545 and the conductive via 542. In the present embodiment, the capping layer 535 may be integrated to modulate the resistance between the conductive via 542 and the first contact 545. In the present embodiment, the third contact 547 may be formed of the topological material.

Figure 13:
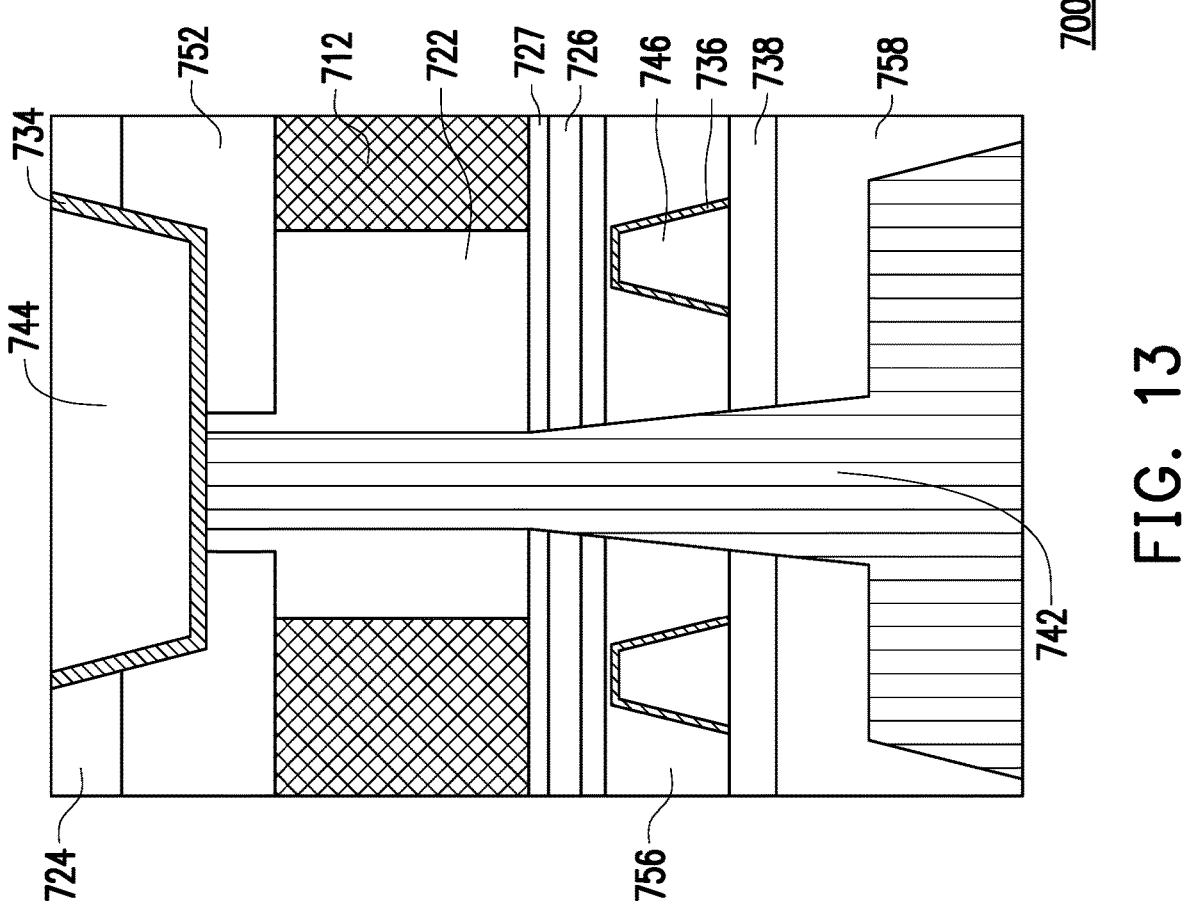
FIG. 13 is a schematic cross-sectional view showing a semiconductor structure in accordance with another embodiment of the disclosure.

FIG. 13 is a schematic cross-sectional view showing a semiconductor structure 700 in accordance with another embodiment of the disclosure. In the present embodiment, the configuration of the semiconductor structure 700 is similar to the semiconductor structure 500 in the above embodiment. As shown in FIG. 13, the semiconductor structure 700 includes a first dielectric layer 752, a plurality of S/D regions 712 and a cutting metal gate 722. As shown in FIG. 13, the S/D regions 712 are disposed below the first dielectric layer 752. In addition, the semiconductor structure 700 includes a hard mask layer 724 disposed above the first dielectric layer 752. Referring to FIG. 13, a second dielectric layer 758 and a third dielectric layer 756 disposed below the S/D regions 712 are also included in the semiconductor structure 700. In the present embodiments, a pair of first barrier liners 727 with an oxide layer 726 embedded therebetween may be disposed between the S/D regions 712 and the third dielectric layer 756. Moreover, a second barrier liner 738 may be disposed between the second dielectric layer 758 and the third dielectric layer 756.

As shown in FIG. 13, a first contact 744 covered by a barrier layer 734 may be disposed to penetrate the hard mask layer 724 and a portion of the first dielectric layer 752. Moreover, a second contact 748 and a conductive via 742 electrically connecting the first contact 744 and the second contact 748 are formed integrally by filling, for example, the anisotropic transport material to penetrate the first dielectric layer 752, the cutting metal gate 722, the second dielectric layer 758, and the third dielectric layer 756.

In the present embodiment, a plurality of third contacts 746 respectively covered by barrier layers 736 are disposed aside the conductive via 742 in the third dielectric layer 756. In some embodiments, the third contacts 746 may be formed of a conventional conductive metal such as copper.

Figures 14A, 14B:
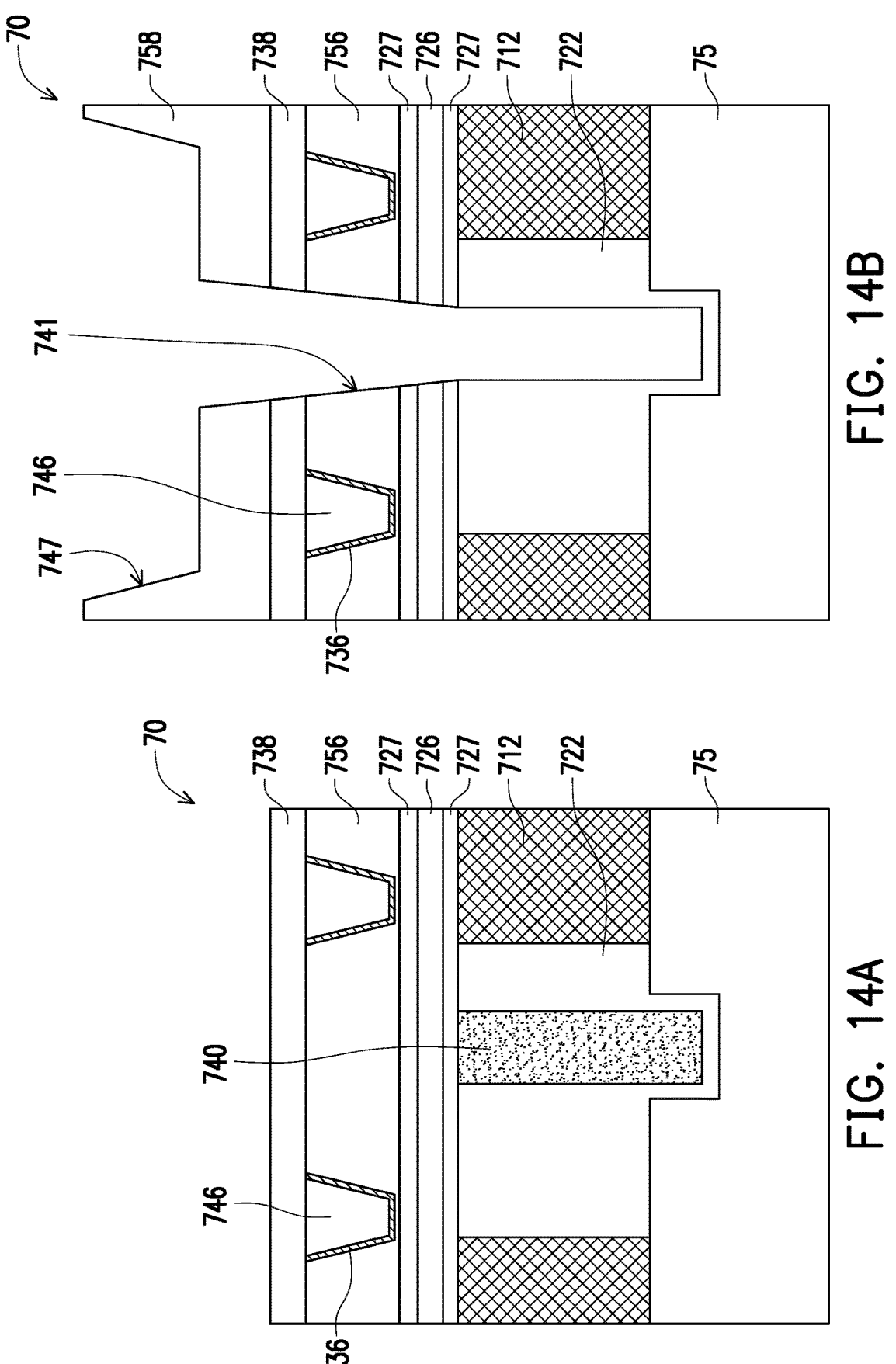
FIG. 14A to FIG. 14J are schematic cross-sectional views illustrating a method of forming a semiconductor structure according to an embodiment of the disclosure.

FIG. 14A to FIG. 14J are schematic cross-sectional views illustrating a method of forming a semiconductor structure 700 according to an embodiment of the disclosure. FIG. 15 is a flowchart of a method for forming a semiconductor structure 700 according to various aspects of the present disclosure. Referring to FIG. 14A and FIG. 15, in the step 802, a substrate 70 having an oxide via 740 embedded therein and a dielectric layer 75 disposed therebelow is provided. Referring to FIG. 14B and FIG. 15, in the manufacturing step 804, a second dielectric layer 758 is disposed over the substrate 70. A via hole 741 and a trench 747 are formed to penetrate the second dielectric layer 758, the substrate 70, and a portion of the dielectric layer 75.

Figure 14D:
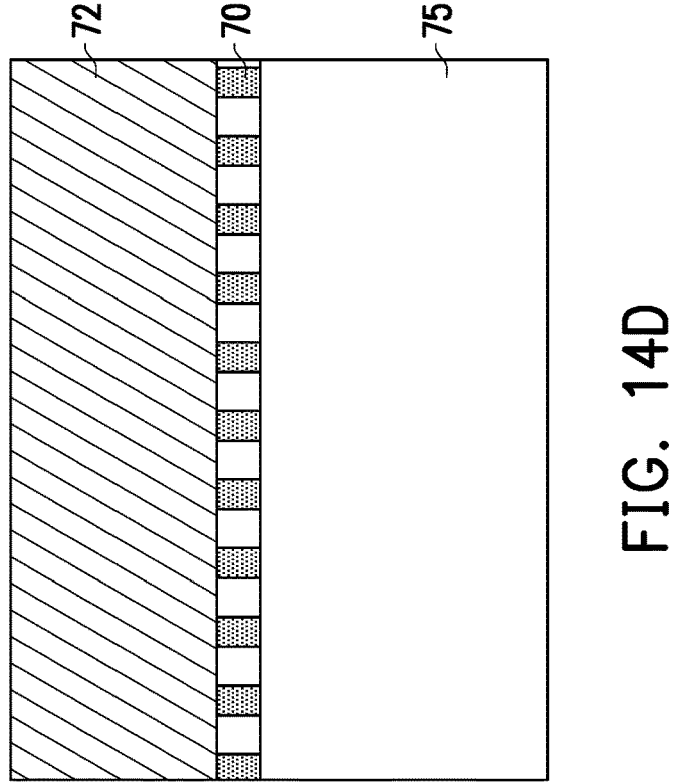
Figure 14C:
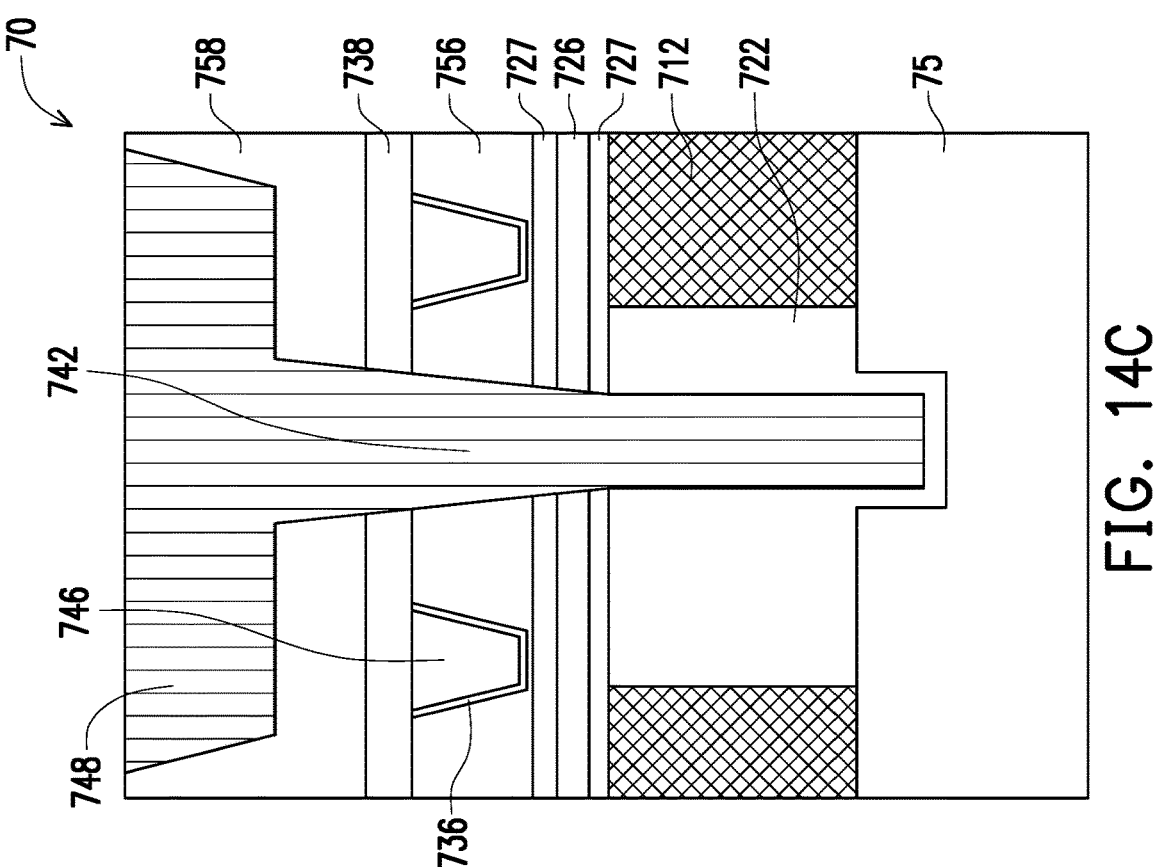

Referring to FIG. 14C and FIG. 15, in the manufacturing step 806, in the present embodiment, an anisotropic transport material is then filled into the via hole 741 and the trench 747 to form a conductive via 742 and a second contact 748. In some other embodiments, the via hole 741 and the trench 747 may be also filled with a topological material.

Figure 14F:
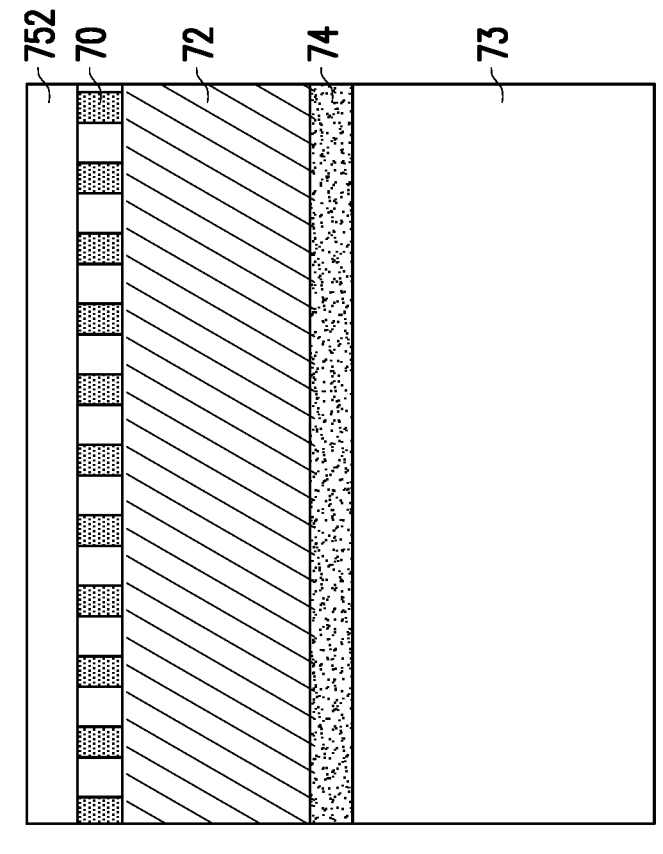
Figure 14E:
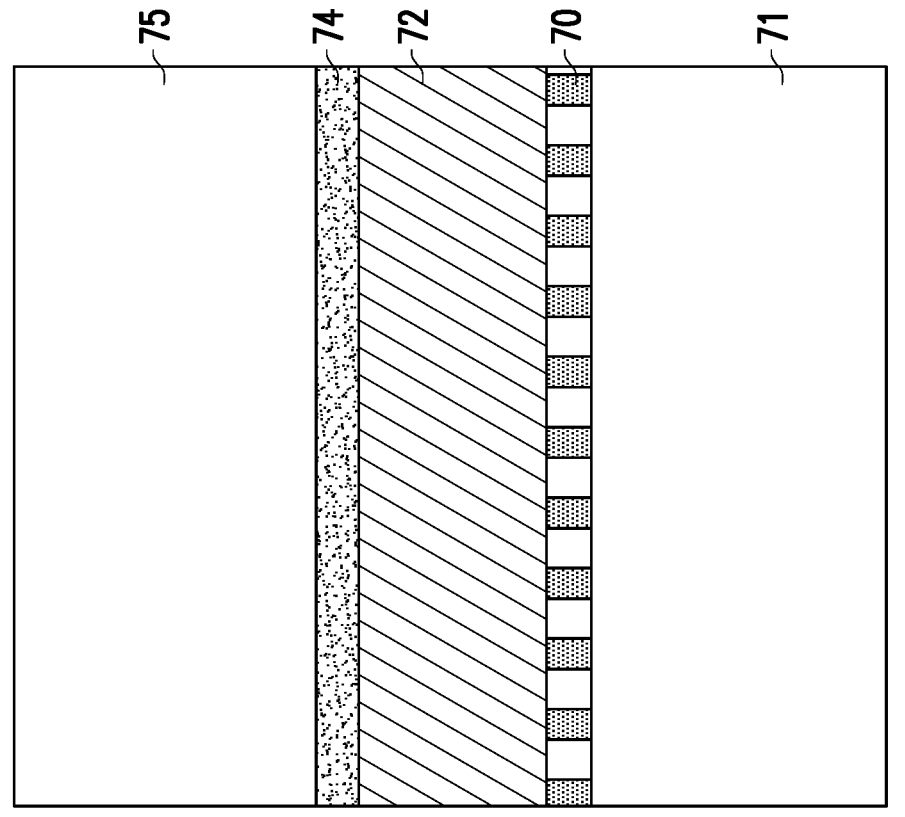

Referring to FIG. 14D, FIG. 14E, and FIG. 15, in the manufacturing step 808, a carrier 72 is bonded to a back side of the substrate 70. In accordance with the embodiment in FIG. 14F, FIG. 14G, and FIG. 15, in the manufacturing step 810, the substrate 70 and the dielectric layer 75 are flipped for thinning down the dielectric layer 75 to form the first dielectric layer 752 as shown in FIG. 14F.

Figures 14G, 14H:
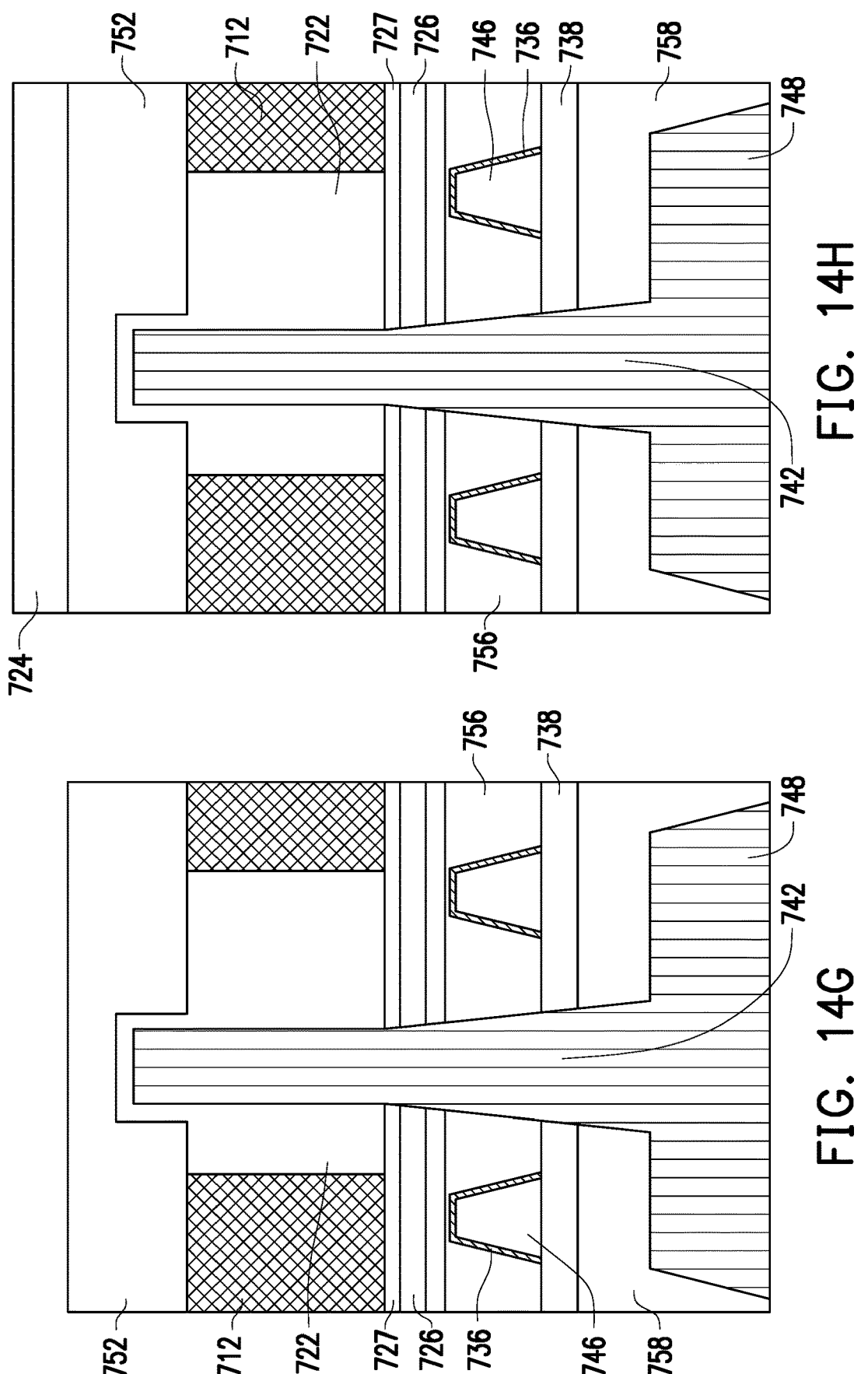
Figures 14I, 14J:
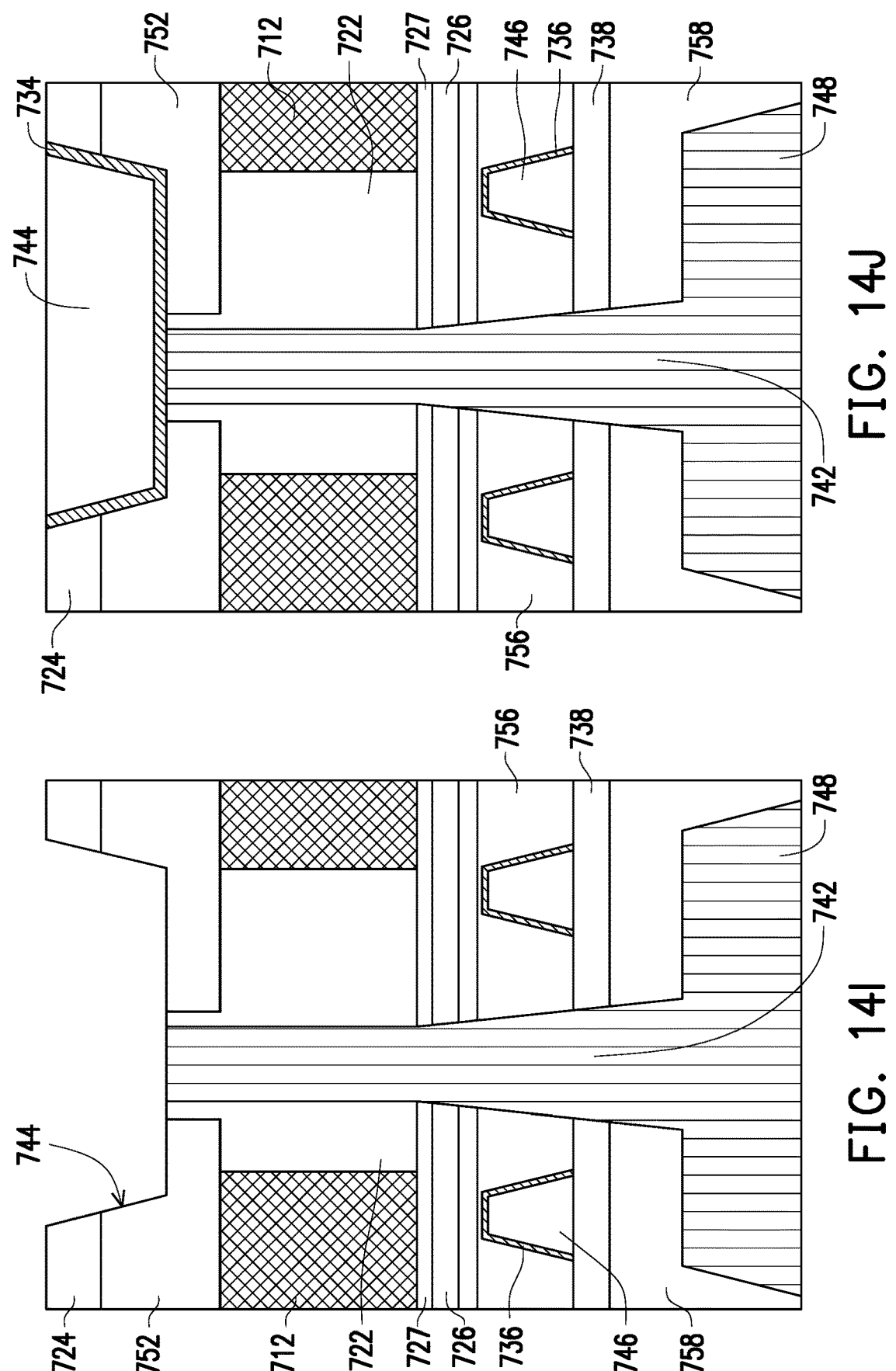

Referring to FIG. 14H and FIG. 15, in the manufacturing step 812, after thinning down the dielectric layer 75, the hard mask layer 724 is then deposited on the first dielectric layer 752. In accordance with the manufacturing process in FIG. 14I and FIG. 15, in the manufacturing step 814, a trench 744 penetrating through the hard mask layer 724 and a portion of the first dielectric layer 752 is formed. Referring to FIG. 14J and FIG. 15, in the step 816, a barrier layer 734 is deposited in the trench 744, and a conductive metal material, such as copper, is subsequentially deposited into the trench 744 for forming the first contact 744.

Comparing to the manufacturing method in the embodiment of FIG. 10A to FIG. 10F, in the present embodiment, the conductive via 742 and the second contact 748 are integrally formed in a front side of the semiconductor structure 700 prior to forming the first contact 744.

Figures 16A, 16B:
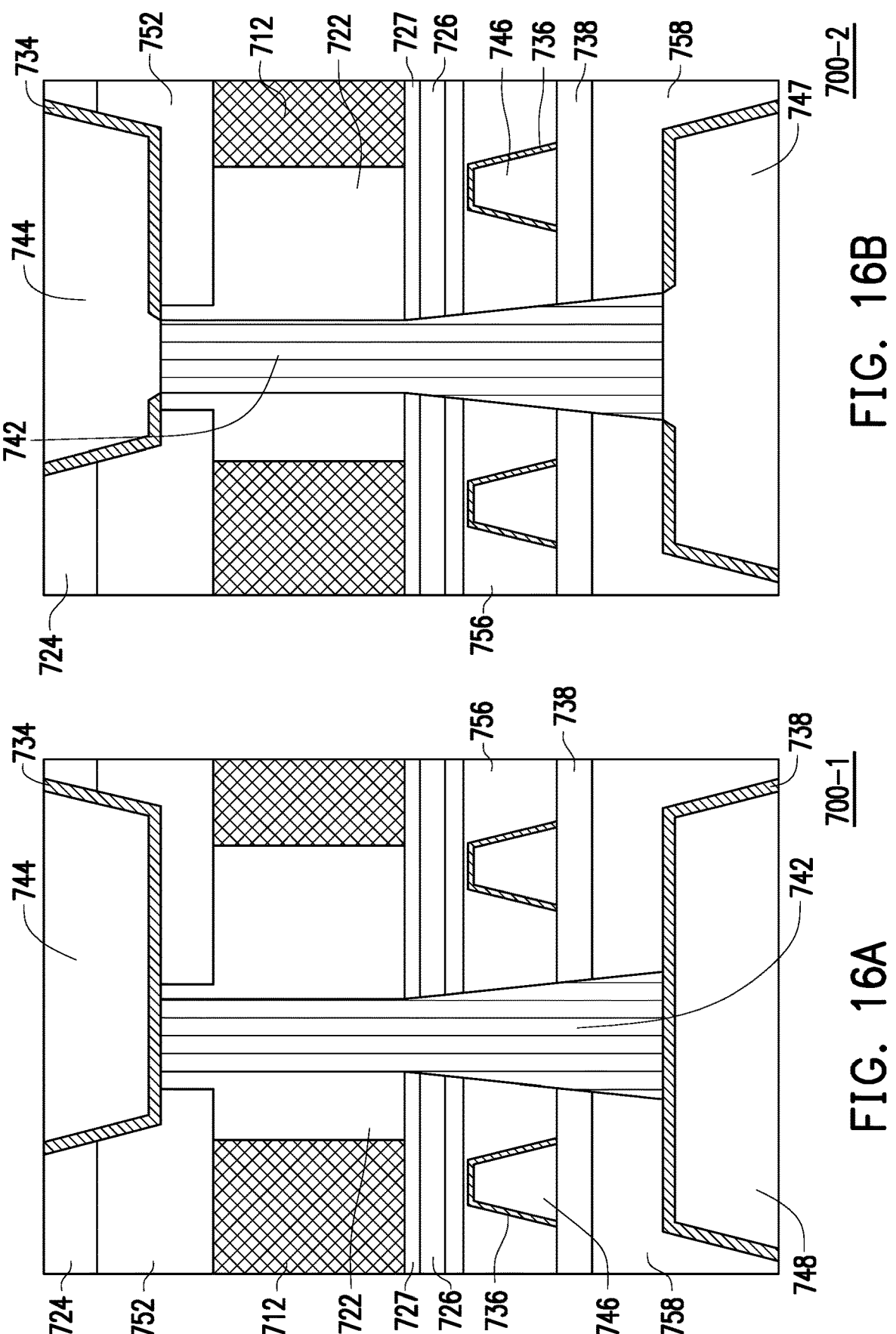
FIG. 16A is a schematic cross-sectional view showing a semiconductor structure in accordance with another embodiment of the disclosure.
FIG. 16B is a schematic cross-sectional view showing a semiconductor structure in accordance with another embodiment of the disclosure.

FIG. 16A is a schematic cross-sectional view showing a semiconductor structure 700-1 in accordance with another embodiment of the disclosure. In accordance with a semiconductor structure 700-1 shown in FIG. 16A, comparing to the semiconductor structure 700, a barrier layer 738 and a second contact 748 formed of a conventional metal material such as copper are formed in the second dielectric layer 758.

FIG. 16B is a schematic cross-sectional view showing a semiconductor structure 700-2 in accordance with another embodiment of the disclosure. Referring to FIG. 16B, in the semiconductor structure 700-2, barrier-free interfaces may be respectively disposed between the first contact 744 and the conductive via 742 and between the second contact 747 and the conductive via 742. Namely, the conductive via 742 is direct contact with the first contact 744 and the second contact 747 without barrier layers disposed therebetween to further reduce the conductive resistivity.

Figures 16C, 16D:
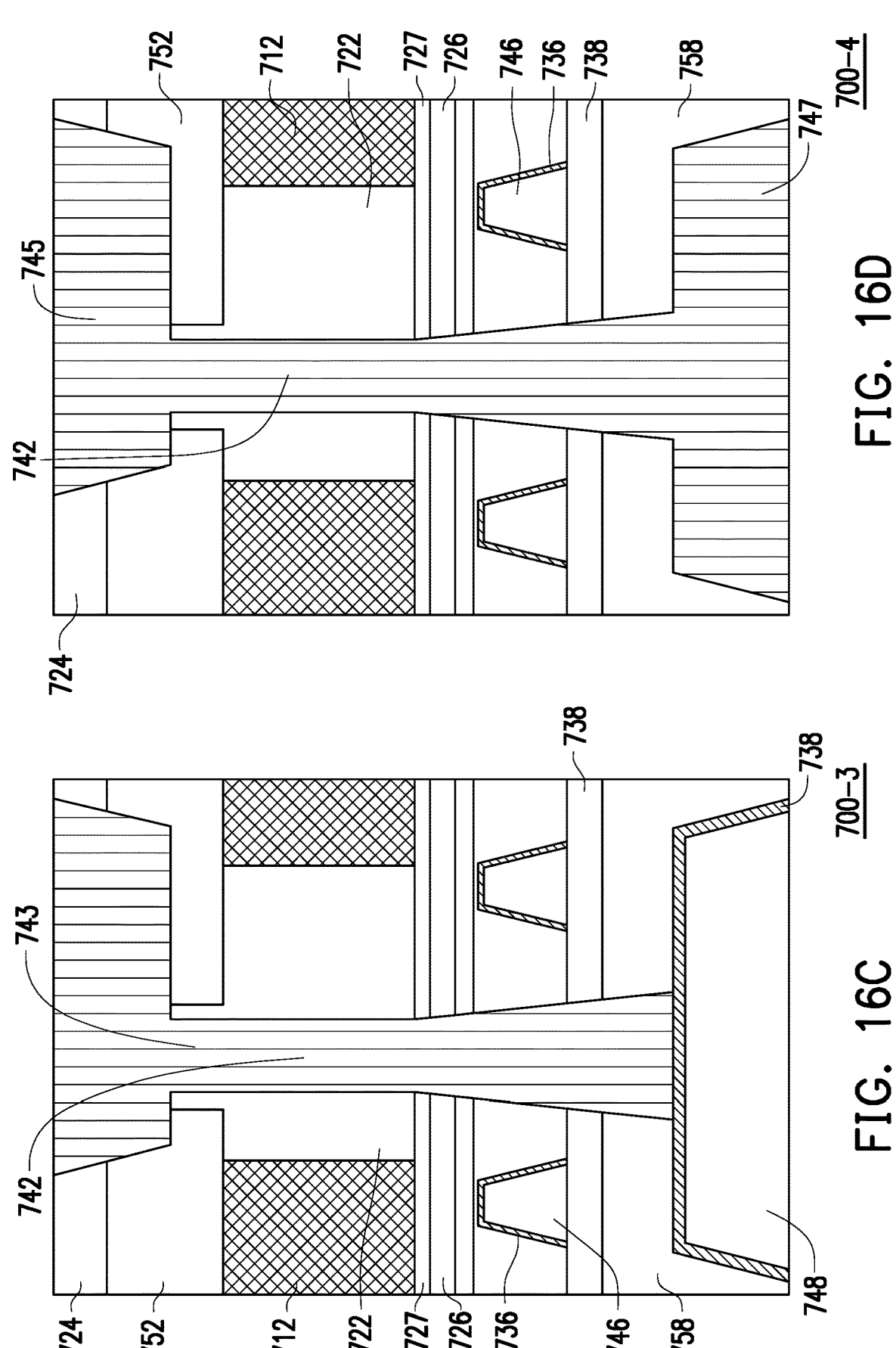
FIG. 16C is a schematic cross-sectional view showing a semiconductor structure in accordance with another embodiment of the disclosure.
FIG. 16D is a schematic cross-sectional view showing a semiconductor structure in accordance with another embodiment of the disclosure.

FIG. 16C is a schematic cross-sectional view showing a semiconductor structure 700-3 in accordance with another embodiment of the disclosure. In the present embodiment, as the semiconductor structure 700-3 shown in FIG. 16C, both the conductive via 742 and the first contact 743, penetrating through the hard mask layer 724 and a portion of the first dielectric layer 752, are integrally formed of the anisotropic transport material. Referring to FIG. 16C, the second contact 748 in the present embodiment is formed of the conventional metal material such as copper.

FIG. 16D is a schematic cross-sectional view showing a semiconductor structure 700-4 in accordance with another embodiment of the disclosure. Comparing with the semiconductor structure 700 shown in the embodiment of FIG. 13, as the semiconductor structure 700-4 shown in FIG. 16D, a first contact 745, a second contact 747, and the conductive via 742 electrically connected therebetween may be all formed of the anisotropic transport material.

In accordance with some embodiments, a semiconductor structure includes a substrate, at least one gate electrode, a plurality of source/drain (S/D) regions, a backside contact, a first dielectric layer, and a conductive via. The at least one gate electrode is disposed in the substrate. The S/D regions is disposed in the substrate and laterally disposed aside the at least one gate electrode. The backside contact is disposed above the S/D regions and the at least one gate electrode. The first dielectric layer is disposed between the backside contact and the plurality of S/D regions and the at least one gate electrode. The conductive via is extended through the first dielectric layer to electrically connect the S/D regions and the backside contact. The conductive via includes an anisotropic transport material or a topological material.

In accordance with some embodiments, a semiconductor structure includes a substrate, a first dielectric layer, a plurality of S/D regions, a first contact, a second dielectric layer, a second contact, and a conductive via. The first dielectric layer is disposed over the substrate. The first contact penetrates through the first dielectric layer to electrically connect the S/D regions. The second dielectric layer is disposed below the S/D regions. The second contact penetrates through the second dielectric layer. The conductive via penetrates through the substrate to electrically connect the first contact and the second contact. The S/D regions are disposed aside the conductive via. The conductive via includes anisotropic transport material or a topological material.

In accordance with some embodiments, a method of manufacturing semiconductor structure includes the following steps. A substrate having a plurality of source/drain (S/D) regions and at least one gate electrode is provided. A first dielectric layer is formed over the substrate. The second dielectric layer is formed below the first dielectric layer, the S/D regions, and the at least one gate electrode. A first contact penetrating through the first dielectric layer is formed to. A second contact penetrating through the second dielectric layer is formed. A conductive via penetrating through the substrate is formed to electrically connect the first contact and the second contact. The conductive via is formed of an anisotropic transport material or a topological material.

What is claimed is:

1. A semiconductor structure, comprising:
a substrate;
a plurality of source/drain (S/D) regions disposed in the substrate;
a backside contact, disposed above the plurality of S/D regions;
a first dielectric layer disposed between the backside contact and the plurality of S/D regions; and a conductive via, extended through the first dielectric layer to electrically connect the plurality of S/D regions and the backside contact, wherein the conductive via comprises an anisotropic transport material,
wherein the backside contact comprises materials having isotropic conductivity, and directional conductivities of the backside contact and the conductive via are different from each other.

2. The semiconductor structure of claim 1, further comprising a barrier layer disposed between the backside contact and the conductive via.

3. The semiconductor structure of claim 1, wherein a top surface of the conductive via is exposed from a barrier layer, and the backside contact is in direct contact with the conductive via.

4. The semiconductor structure of claim 1, further comprising a hard mask layer disposed between the backside contact and the first dielectric layer.

5. The semiconductor structure of claim 1, further comprising a capping layer disposed between the backside contact and the conductive via.

6. The semiconductor structure of claim 1, wherein the conductive via comprises a protrusion portion protruding toward the backside contact, and a barrier layer is disposed between the protrusion portion and the backside contact.

7. The semiconductor structure of claim 1, wherein the anisotropic transport material comprises $M_{n+1}AX$ phases,
wherein M are early transition metals comprising Sc, Cr, Zr, Nb, Mo, or Hf, n is equal to 1 to 4, A are elements comprising Zn, Cd, Ga, In, Ti, Ge, Sn, Pb, P, As, or S, and X are elements comprising C.

8. A semiconductor structure, comprising:
a substrate;
a first dielectric layer, disposed over the substrate;
a plurality of source/drain (S/D) regions, disposed in the substrate;
a first contact, penetrating through the first dielectric layer to electrically connect the plurality of S/D regions;
a second dielectric layer, disposed below the plurality of S/D regions;
a second contact, penetrating through the second dielectric layer; and
a conductive via, penetrating through the substrate to electrically connect the first contact and the second contact, wherein the plurality of S/D regions is disposed aside the conductive via, and the conductive via comprises an anisotropic transport material,
wherein the first contact and the second contact comprise materials different from materials of the conductive via,
wherein directional conductivities of the first contact and the second contact are different from directional conductivity of the conductive via.

9. The semiconductor structure of claim 8, further comprising a cutting metal gate laterally disposed aside the plurality of S/D regions and the conductive via.

10. The semiconductor structure of claim 8, further comprising a capping layer disposed between the first contact and the conductive via.

11. The semiconductor structure of claim 8, further comprising a barrier liner disposed between the first contact and the conductive via.

12. The semiconductor structure of claim 8, wherein the material of the first contact comprises a topological material.

13. The semiconductor structure of claim 8, wherein the material of the second contact comprises a topological material.

14. A method of manufacturing a semiconductor structure, comprising:

providing a substrate having a plurality of source/drain (S/D) regions formed therein;

forming a first dielectric layer over the substrate;

forming a second dielectric layer below the first dielectric layer and the plurality of S/D regions;

forming a first contact penetrating through the first dielectric layer;

forming a second contact penetrating through the second dielectric layer; and forming a conductive via penetrating through the substrate to electrically connect the first contact and the second contact, wherein the conductive via is formed of an anisotropic transport material, wherein the first contact and the second contact comprise forming materials different from the forming material of the conductive via, wherein directional conductivities of the first contact and the second contact are different from directional conductivity of the conductive via.

15. The method of claim 14, further comprising forming a third dielectric layer and a third contact below the plurality of S/D regions and aside the conductive via.

16. The method of claim 14, further comprising forming an oxide-filled trench embedded the substrate prior to the step of forming the conductive via.

17. The method of claim 14, further comprising forming a cutting metal gate laterally disposed aside the plurality of S/D regions and the conductive via.

18. The method of claim 14, further comprising forming a capping layer between the first contact and the conductive via.

19. The method of claim 14, further comprising forming a barrier liner disposed between the first contact and the conductive via.

20. The method of claim 14, further comprising forming a hard mask layer on the second dielectric layer.

* * * * *